(12) United States Patent
Thei et al.

(10) Patent No.: US 11,251,286 B2
(45) Date of Patent: Feb. 15, 2022

(54) METHOD AND RELATED APPARATUS FOR REDUCING GATE-INDUCED DRAIN LEAKAGE IN SEMICONDUCTOR DEVICES

(71) Applicant: Taiwan Semiconductor Manufacturing Co., Ltd., Hsin-Chu (TW)

(72) Inventors: Kong-Beng Thei, Pao-Shan Village (TW); Chien-Chih Chou, New Taipei (TW); Hsiao-Chin Tuan, Taowan (TW); Yi-Huan Chen, Hsin Chu (TW); Alexander Kalnitsky, San Francisco, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 75 days.

(21) Appl. No.: 16/693,670

(22) Filed: Nov. 25, 2019

(65) Prior Publication Data

US 2020/0091310 A1    Mar. 19, 2020

Related U.S. Application Data

(63) Continuation of application No. 15/992,817, filed on May 30, 2018, now Pat. No. 10,535,752.

(51) Int. Cl.
*H01L 29/66* (2006.01)
*H01L 21/768* (2006.01)
*H01L 29/78* (2006.01)

(52) U.S. Cl.
CPC .... *H01L 29/6656* (2013.01); *H01L 21/76895* (2013.01); *H01L 29/66492* (2013.01); *H01L 29/7833* (2013.01)

(58) Field of Classification Search
CPC .......... H01L 29/6656; H01L 21/76895; H01L 29/66492; H01L 29/7833;
(Continued)

(56) References Cited

U.S. PATENT DOCUMENTS 5,545,575 A * 8/1996 Cheng ............. H01L 21/823807
257/E21.427
2013/0299919 A1   11/2013 Chen et al.
(Continued)

OTHER PUBLICATIONS

Non-Final Office Action dated May 29, 2019 for U.S. Appl. No. 15/992,817.
(Continued)

*Primary Examiner* — Julia Slutsker
(74) *Attorney, Agent, or Firm* — Eschweiler & Potashnik, LLC

(57) ABSTRACT

In some embodiments, a semiconductor device is provided. The semiconductor device includes a pair of source/drain regions disposed in a semiconductor substrate, where the source/drain regions are laterally spaced. A gate electrode is disposed over the semiconductor substrate between the source/drain regions. Sidewall spacers are disposed over the semiconductor substrate on opposite sides of the gate electrode. A silicide blocking structure is disposed over the sidewalls spacers, where respective sides of the source/drain regions facing the gate electrode are spaced apart from outer sides of the sidewall spacers and are substantially aligned with outer sidewalls of the silicide blocking structure.

20 Claims, 10 Drawing Sheets

(58) Field of Classification Search
CPC ........... H01L 21/823468; H01L 27/088; H01L 21/823462
See application file for complete search history.

(56) References Cited

U.S. PATENT DOCUMENTS

2015/0162323 A1 6/2015 Taya et al.
2016/0254358 A1 9/2016 Tsai et al.

OTHER PUBLICATIONS

Final Office Action dated Sep. 30, 2019 for U.S. Appl. No. 15/992,817.
Notice of Allowance dated Nov. 12, 2019 foe U.S. Appl. No. 15/992,817.

* cited by examiner

METHOD AND RELATED APPARATUS FOR REDUCING GATE-INDUCED DRAIN LEAKAGE IN SEMICONDUCTOR DEVICES

REFERENCE TO RELATED APPLICATION

This application is a Continuation of U.S. application Ser. No. 15/992,817, filed on May 30, 2018, the contents of which are hereby incorporated by reference in their entirety.

BACKGROUND

Semiconductor devices are electronic components that exploit electronic properties of semiconductor materials to affect electrons or their associated fields. A widely used type of semiconductor device is a field-effect transistor (FET). A FET comprises a pair of source/drain regions, a selectively-conductive channel, and a gate electrode. FETs are versatile devices that may be used for, among other things, switches, amplifiers, and memory. Examples of FETs include metal-oxide-semiconductor field-effect transistors (MOSFETs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
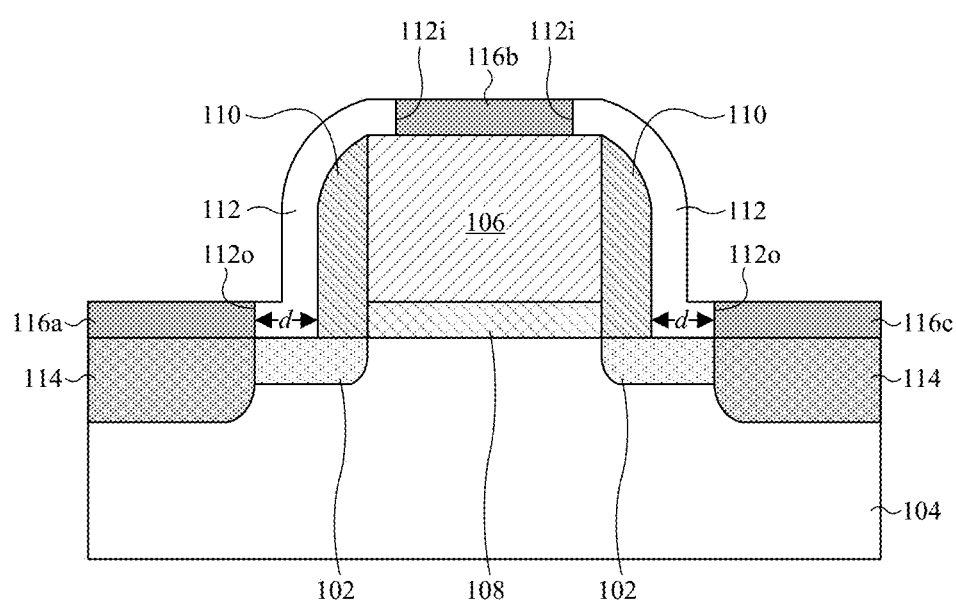
FIG. 1 illustrates a cross-sectional view of some embodiments of a semiconductor device having a pair of source/drain regions disposed in a semiconductor substrate that are respectively separated from a gate electrode by a sidewall spacer and a silicide blocking structure.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a metal-oxide-semiconductor field-effect transistor (MOSFET) comprises a pair of source/drain regions. The source/drain regions are disposed in a semiconductor substrate and are laterally spaced. Further, the MOSFET comprises a selectively-conductive channel, a gate dielectric, and a gate electrode. The selectively-conductive channel is disposed in the semiconductor substrate and extends laterally from one of the source/drain regions to another one of the source/drain regions. The gate dielectric and the gate electrode are stacked over the selectively-conductive channel and arranged between the source/drain regions.

A challenge with the above MOSFET is off-state leakage current. One source of off-state leakage current is gate-induced drain leakage (GIDL) current. GIDL is caused by a deep-depletion region forming in a portion of the semiconductor substrate where the gate electrode overlaps a source/drain region. For example, when the MOSFET is an "off-state," the source/drain region is connected to a first bias (e.g., a positive supply voltage) and the gate electrode is connected to a second bias (e.g., ground and/or a negative supply voltage). Due to the electric potential between the source/drain region and the gate electrode, an electric field between the source/drain region and the gate electrode causes a deep-depletion region to form near the portion of the semiconductor substrate where the gate electrode overlaps the source/drain region. This deep-depletion region may cause band-to-band tunneling to occur between the source/drain region and the semiconductor substrate. Thus, even though the MOSFET is in the "off-state," GIDL current may flow from the source/drain region to the semiconductor substrate, which may result in the MOSFET having high stand-by power consumption (e.g., the amount of power the MOSFET consumes in the "off-state")

Therefore, various embodiments of the present disclosure are directed toward a semiconductor device having a source/drain region disposed in a semiconductor substrate and separated from a gate electrode by a sidewall spacer and a silicide blocking structure. The sidewall spacer is disposed over the semiconductor substrate and along a side of the gate electrode. The silicide blocking structure is disposed over the sidewall spacer and over the semiconductor substrate. The silicide blocking structure has an outer sidewall that is spaced from the sidewall spacer by a non-zero distance. A side of the source/drain region facing the gate electrode is substantially aligned with the outer sidewall of the silicide blocking structure. Because the side of the source/drain region is substantially aligned with the outer sidewall of the silicide blocking structure, the source/drain region is spaced from the side of the gate electrode by the non-zero distance and the sidewall spacer. Thus, the negative effects (e.g., formation of the deep-depletion region near the portion of the semiconductor substrate where the gate electrode overlaps the source/drain region) related to GIDL may be reduced by spacing the source/drain region from the gate electrode by the non-zero distance and the sidewall spacer. Accordingly, the stand-by power consumption of the MOSFET may be reduced.

FIG. 1 illustrates a cross-sectional view of some embodiments of a semiconductor device 100 having a pair of source/drain regions 114 disposed in a semiconductor substrate 104 that are respectively separated from a gate electrode 106 by a sidewall spacer 110 and a silicide blocking structure 112.

The semiconductor device 100 comprises a pair of lightly-doped source/drain extensions 102 disposed in a semiconductor substrate 104. The lightly-doped source/drain extensions 102 are laterally spaced from one another. In some embodiments, the lightly-doped source/drain extensions 102 may comprise a first doping type (e.g., n-type doping). In further embodiments, the lightly-doped source/drain extensions 102 may comprise a first doping concentration.

A gate electrode 106 and a gate dielectric 108 are stacked over the semiconductor substrate 104 and disposed between the lightly-doped source/drain extensions 102. The gate dielectric 108 is disposed between the gate electrode 106 and the semiconductor substrate 104.

Sidewall spacers 110 are disposed over the semiconductor substrate 104 and respectively along opposing sides of the gate electrode 106. In some embodiments, the sidewall spacers 110 may be respectively disposed along opposing sides of the gate dielectric 108. In further embodiments, the sidewall spacers 110 may be respectively disposed over the lightly-doped source/drain extensions 102.

A silicide blocking structure 112 is disposed over the sidewall spacers 110 and the semiconductor substrate 104. The silicide blocking structure 112 extends vertically from the semiconductor substrate 104 along outer sides of the sidewall spacers 110. In some embodiments, the silicide blocking structure 112 may be disposed over the gate electrode 106, such that the silicide blocking structure 112 overlaps the gate electrode 106 in a vertical direction. In further embodiments, the silicide blocking structure 112 may have inner sidewalls 112i disposed over the gate electrode 106. In other embodiments, the inner sidewalls 112i of the silicide blocking structure 112 may be substantially aligned with sides of the gate electrode 106. In yet further embodiments, the silicide blocking structure 112 may have outer sidewalls 112o that are respectively spaced from the outer sides of the sidewall spacers 110 by a non-zero distance d.

A pair of source/drain regions 114 are disposed in the semiconductor substrate 104. The source/drain regions 114 are laterally spaced from one another. In some embodiments, the source/drain regions 114 may comprise the first doping type (e.g., n-type doping). In some embodiments, the source/drain regions 114 may comprise a second doping concentration greater than the first doping concentration. In further embodiments, respective sides of the source/drain regions 114 facing the gate electrode may be substantially aligned with the outer sidewalls 112o of the silicide blocking structure 112, such that the source/drain regions 114 are respectively spaced from the gate electrode 106 by the sidewall spacers 110 and the non-zero distance d. In yet further embodiments, the source/drain regions 114 may be disposed adjacent the lightly-doped source/drain extensions 102. In some embodiments, the lightly-doped source/drain extensions 102 may respectively extend from the sides of the source/drain regions 114 facing the gate electrode 106 beneath the silicide blocking structure 112 and the sidewalls spacer 110.

A plurality of silicide structures 116a-c are disposed over the semiconductor substrate 104. The plurality of silicide structures 116a-c comprise a first silicide structure 116a, a second silicide structure 116b, and a third silicide structure 116c. In some embodiments, the first silicide structure 116a and the third silicide structure 116c may be respectively disposed over the source/drain regions 114. In further embodiments, the first silicide structure 116a and the third silicide structure 116c may have respective sides facing the gate electrode 106 that are disposed adjacent the outer sidewalls 112o of the silicide blocking structure 112, such that the first silicide structure 116a and the third silicide structure 116c are respectively spaced from the gate electrode 106 by the sidewall spacers 110 and the non-zero distance d. In yet further embodiments, the second silicide structure 116b may be disposed over the gate electrode 106 and disposed between the inner sidewalls 112i of the silicide blocking structure 112.

Because the source/drain regions 114 and/or the first silicide structure 116a and the third silicide structure 116c are spaced from the gate electrode 106 by the sidewall spacers 110 and the non-zero distance d, the negative effects (e.g., formation of the deep-depletion region in the portion of the semiconductor substrate where the gate electrode overlaps the source/drain region) related to GIDL may be reduced. Accordingly, the stand-by power consumption of the semiconductor device 100 may be reduced.

Figure 2:
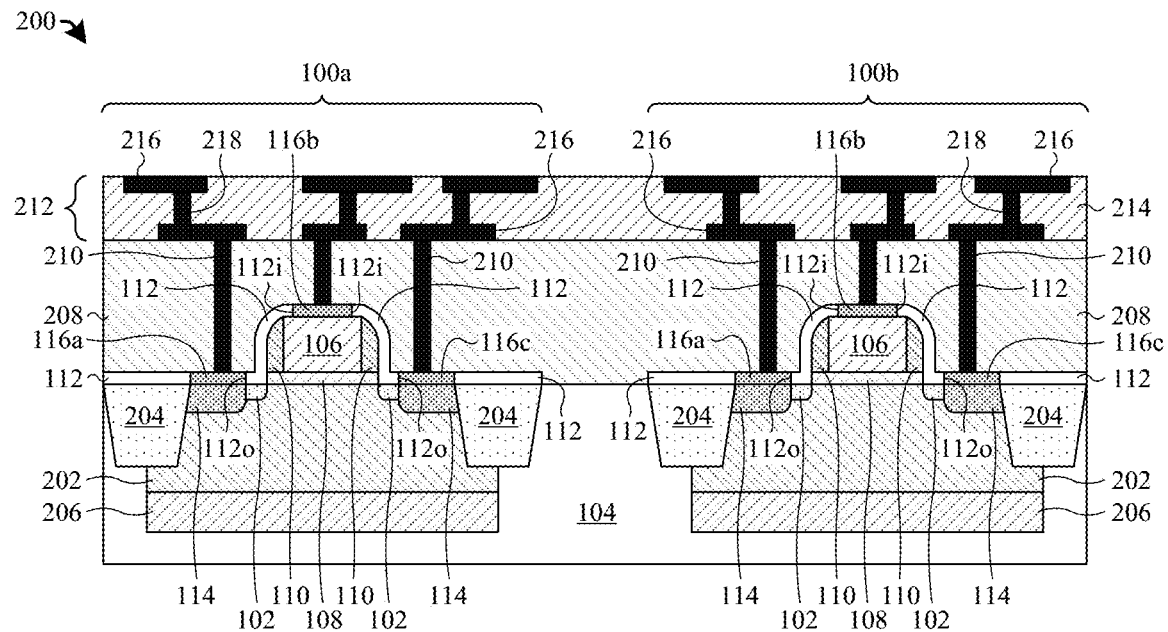
FIG. 2 illustrates a cross-sectional view of some embodiments of an integrated circuit (IC) having a plurality of semiconductor devices each having a pair of source/drain regions disposed in a semiconductor substrate that are respectively separated from a gate electrode by a sidewall spacer and a silicide blocking structure.

FIG. 2 illustrates a cross-sectional view of some embodiments of an integrated circuit (IC) 200 having a plurality of semiconductor devices 100a-b each having a pair of source/drain regions 114 disposed in a semiconductor substrate 104 that are respectively separated from a gate electrode 106 by a sidewall spacer 110 and a silicide blocking structure 112.

The IC 200 comprises a plurality of semiconductor devices 100a-b. The plurality of semiconductor devices 100a-b comprises a first semiconductor device 100a and a second semiconductor device 100b. In some embodiments, the semiconductor devices 100a-b may be, for example, low-voltage MOSFETs (e.g., having an operating voltage less than about 2.5 volts (V). In further embodiments, the semiconductor devices 100a-b may be, for example, mid-voltage MOSFETs (e.g., having an operating voltage greater than about 2.5 V and less than about 12 V). In further embodiments, the semiconductor devices 100a-b may be, for example, high-voltage MOSFETs (e.g., having an operating voltage greater than about 12 V). In yet further embodiments, the plurality of semiconductor devices 100a-b may comprise a combination of low-voltage MOSFETs, mid-voltage MOSFETs, and/or high-voltage MOSFETs.

The semiconductor devices 100a-b respectively comprise a first well region 202 disposed in a semiconductor substrate 104. In some embodiments, the first well region 202 may comprise a first doping type (e.g., n-type doping). In other embodiments, the first well region 202 may comprise a second doping type (e.g., p-type doping). In further embodiments, the first well region 202 of the first semiconductor device 100a may comprise the first doping type and the first well region 202 of the second semiconductor device 100b may comprise the second doping type.

The semiconductor devices 100a-b respectively comprise an isolation structure 204 disposed in the semiconductor substrate 104. The isolation structure 204 may be a shallow trench isolation (STI) structure or a deep trench isolation (DTI) structure. In some embodiments, the first well region 202 may respectively extend beneath the isolation structure 204, such that the first well region 202 respectively has sides disposed beneath the isolation structure 204.

The semiconductor devices 100a-b respectively comprise a second well region 206 disposed in the semiconductor substrate 104. The second well region 206 is disposed beneath the first well region 202. In some embodiments, the second well region 206 is disposed beneath the isolation structure 204. In some embodiments, the second well region 206 may comprise the first doping type (e.g., n-type doping). In further embodiments, the second well region 206 of the first semiconductor device 100a and the second well region 206 of the second semiconductor device 100b may be discrete regions. In other embodiments, the second well region 206 of the first semiconductor device 100a and the second well region 206 of the second semiconductor device 100b may be a continuous region that that extends beneath the first well region 202 of the first semiconductor device 100a, the isolation structure 204 of the first semiconductor device 100a, the first well region 202 of the second semiconductor device 100b, and the isolation structure of the second semiconductor device 100b.

The semiconductor devices 100a-b respectively comprise a pair of lightly-doped source/drain extensions 102 disposed in the semiconductor substrate 104. The pair of lightly-doped source/drain extensions 102 may be respectively disposed in the first well region 202. The lightly-doped source/drain extensions 102 are laterally spaced from one another. In some embodiments, the lightly-doped source/drain extensions 102 may comprise a doping type opposite the doping type of the first well region 202.

The semiconductor devices 100a-b respectively comprise a gate electrode 106 and a gate dielectric 108 stacked over the semiconductor substrate 104. The gate electrode 106 and the gate dielectric 108 may be respectively disposed between the lightly-doped source/drain extensions 102. The gate dielectric 208 separates the gate electrodes 106 from the semiconductor substrate 104. In some embodiments, the gate electrode 106 of the first semiconductor device 100a is spaced from the gate electrode 106 of the second semiconductor device by at least about 0.2 micrometers (μm).

In some embodiments, the gate electrode 106 may comprise, for example, doped polysilicon, fully-silicided polysilicon, a metal (e.g., aluminum, copper, titanium, tantalum, tungsten, molybdenum, cobalt, etc.), or some other suitable conductor. In further embodiments, the gate dielectric 108 may comprise, for example, an oxide (e.g., SiO$_2$), a high-k dielectric material (e.g., hafnium oxide, hafnium silicon oxide, hafnium tantalum oxide, aluminum oxide, zirconium oxide, etc.), or some other suitable dielectric.

The semiconductor devices 100a-b respectively comprise sidewall spacers 110 disposed over the semiconductor substrate 104 and respectively along opposing sides of the gate electrodes 106. In some embodiments, the sidewall spacers 110 may be respectively disposed over the gate dielectric 108. In further embodiments, the sidewall spacers 110 may have respective sides that are substantially aligned with sides of the gate dielectric 108. In further embodiments, the lightly-doped source/drain extensions 102 may respectively have sides facing the gate electrode 106 that are substantially aligned with outer sides of the sidewall spacers 110. In yet further embodiments, the sidewall spacers 110 may comprise an oxide, a nitride, a carbide, or some other suitable dielectric. In some embodiments, the sidewall spacers may have a thickness greater than or equal to about 0.018 μm.

The semiconductor devices 100a-b respectively comprise a silicide blocking structure 112 disposed over the sidewall spacers 110 and the semiconductor substrate 104. In some embodiments, the silicide blocking structure 112 may have inner sidewalls 112i respectively disposed over a top surface of the gate electrode 106. In some embodiments, the inner sidewalls 112i may respectively be spaced from the sidewall spacers 110 by about 0.1 μm to about 1 μm. In further embodiments, a ratio between a distance the inner sidewalls 112i are respectively spaced from the sidewalls spacers 110 and a distance in which the lightly-doped source/drain extensions 102 are laterally spaced may be about 0.005 to about 3.33. In yet further embodiments, the ratio between the distance the inner sidewalls 112i are respectively spaced from the sidewalls spacers 110 and the distance in which the lightly-doped source/drain extensions 102 are laterally spaced may be about 0.33 to about 0.05.

In some embodiments, the silicide blocking structure 112 may have outer sidewalls 112o that are respectively spaced in a lateral direction from the sidewall spacers 110 by a non-zero distance (See, e.g., FIG. 1—non-zero distance d). In some embodiments, the non-zero distance d may be between about 0.1 μm and about 1 μm. In some embodiments, a ratio between the non-zero distance d and the distance in which the lightly-doped source/drain extensions 102 are laterally spaced may be about 0.005 to about 3.33. In further embodiments, the ratio between the non-zero distance d and the distance in which the lightly-doped source/drain extensions 102 are laterally spaced may be about 0.33 to about 0.05. In yet further embodiments, the silicide blocking structure 112 may have a thickness greater than or equal to about 0.015 μm.

Further, the silicide blocking structure 112 may be disposed over the isolation structure 204. In some embodiments, the silicide blocking structure 112 may directly contact the gate electrode 106, the sidewall spacers 110, the gate dielectric 108, the semiconductor substrate 104, and/or the isolation structure 204. In some embodiments, the silicide blocking structure 112 may comprise silicon nitride, silicon dioxide (SiO$_2$), silicon oxy-nitride (e.g., SiON), or the like. In further embodiments, the silicide blocking structure 112 may comprise a resist protective oxide (RPO). In yet further embodiments, the silicide blocking structure 112 may have a thickness greater than or equal to about 150 angstroms.

The semiconductor devices 100a-b respectively comprise a pair of source/drain regions 114 disposed in the semiconductor substrate 104. The source/drain regions 114 are laterally spaced from one another. The pair of source/drain regions 114 may be disposed in the first well region 202. In some embodiment, the source/drain regions 114 may comprise a doping type opposite the doping type of the first well region 202.

Further, the source/drain regions 114 may be respectively disposed adjacent the lightly-doped source/drain extensions 102. In some embodiments, the source/drain regions 114 may have the same doping type as the lightly-doped source/drain extensions 102 respectively disposed adjacent the source/drain regions 114. In further embodiments, the source/drain regions 114 may have a doping concentration greater than the doping concentration of the lightly-doped source/drain extensions 102 respectively disposed adjacent the source/drain regions 114. In yet further embodiments, respective sides of the source/drain regions 114 facing the gate electrode 106 may be substantially aligned with the outer sidewalls 112o of the silicide blocking structure 112. In such an embodiment, the source/drain regions 114 are respectively spaced from the gate electrode 106 by respective sidewall spacers 110 and the non-zero distance.

The semiconductor devices 100a-b respectively comprise a plurality of silicide structures 116a-c disposed over the semiconductor substrate 104. The plurality of silicide structures 116a-c comprise a first silicide structure 116a, a second silicide structure 116b, and a third silicide structure 116c. In some embodiments, the first silicide structure 116a and the third silicide structure 116c may be respectively disposed over the source/drain regions 114. In some embodiments, the first silicide structure 116a and the third silicide structure 116c may have respective sides facing the gate electrode 106 that are disposed adjacent the outer sidewalls 112o of the silicide blocking structure 112, such that the first silicide structure 116a and the third silicide structure 116c are respectively spaced from the gate electrode 106 by the sidewall spacers 110 and the non-zero distance. In further embodiments, the second silicide structure 116b may be disposed over the gate electrode 106 and disposed between the inner sidewalls 112i of the silicide blocking structure 112. In yet further embodiments, the plurality of silicide structures 116a-c may comprise, for example, nickel, titanium, cobalt, tungsten, or some other electropositive element.

An interlayer dielectric (ILD) layer 208 is disposed over the semiconductor substrate 104. The ILD layer 208 is disposed over the silicide blocking structures 112 and the plurality of silicide structures 116a-c. In some embodiments, the ILD layer 208 contacts a top surface of the semiconductor substrate 104 between the first semiconductor device 100a and the second semiconductor device 100b. In further embodiments, the ILD layer 208 may comprise one or more of a low-k dielectric layer (e.g., a dielectric with a dielectric constant less than about 3.9), an ultra-low-k dielectric layer, or an oxide (e.g., silicon oxide). Further, conductive contacts 210 are disposed in the ILD layer 208. The conductive contacts 210 extend through the ILD layer 208 to the plurality of silicide structures 116a-c. In various embodiments, the conductive contacts 210 may comprise, for example, tungsten, copper, or some other conductive material.

An interconnect structure 212 is disposed over the ILD layer 208. The interconnect structure may comprise one or more inter-metal dielectric (IMD) layers 214. A plurality of conductive lines 216 and a plurality of conductive vias 218 are disposed in the IMD layer 214. The conducive lines 216 and conductive vias 218 are configured to provide electrical connections between various devices disposed throughout the IC 200. In some embodiments, the IMD layer 214 may comprise a low-k dielectric layer, an ultra-low-k dielectric layer, or an oxide. In various embodiments, the conducive lines 216 and conductive vias 218 may comprise, for example, copper, aluminum, or some other conductive material.

Figure 3:
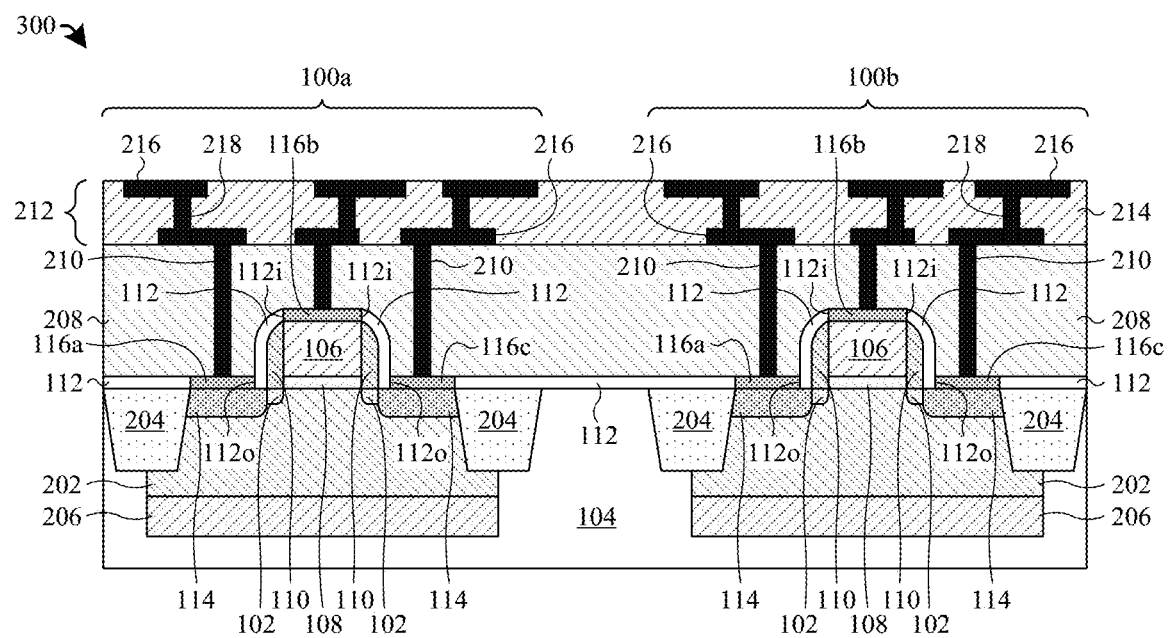
FIG. 3 illustrates a cross-sectional view of some embodiments of an integrated circuit (IC) having a plurality of semiconductor devices each having silicide structures disposed over a semiconductor substrate that are respectively separated from a gate electrode by a sidewall spacer and a silicide blocking structure.

FIG. 3 illustrates a cross-sectional view of some embodiments of an integrated circuit (IC) 300 having a plurality of semiconductor devices 100a-b each having silicide structures disposed over a semiconductor substrate 104 that are respectively separated from a gate electrode 106 by a sidewall spacer 110 and a silicide blocking structure 112.

As shown in FIG. 3, the inner sidewalls 112i of the silicide blocking structure 112 may be substantially aligned with opposing side of the gate electrode 106. In some embodiments, the inner sidewalls 112i of the silicide blocking structure 112 may be substantially aligned with sides of the sidewall spacers 110 facing the gate electrode 106. In further embodiments, the second silicide structure 116b may have sides that are substantially aligned with opposing side of the gate electrode 106, such that the second silicide structure 116b entirely covers an upper surface of the gate electrode 106. In yet further embodiments, the silicide blocking structure 112 may separate the ILD layer 208 from the semiconductor substrate 104 between the first semiconductor device 100a and the second semiconductor device 100b.

The source/drain regions 114 are disposed in the semiconductor substrate 104. In some embodiments, the source/drain regions 114 may respectively have sides facing the gate electrode 106 that are substantially aligned with outer sides of the sidewall spacers 110. In further embodiments, the first silicide structure 116a and the third silicide structure 116c may have respective sides facing the gate electrode 106 that are spaced from the sides of the source/drain regions 114 facing the gate electrode 106 by the silicide blocking structure 112. In yet further embodiments, the lightly-doped source/drain extensions 102 may have respective sides facing the gate electrode 106 that are substantially aligned with sides of the gate electrode 106 and the gate dielectric 108.

FIGS. 4-23 illustrate a series of cross-sectional views of some embodiments for forming an integrated circuit (IC) comprising a plurality of semiconductor devices, where some of the semiconductor devices have a pair of source/drain regions respectively spaced from a gate electrode by a sidewall spacer and a silicide blocking structure.

Figure 4:
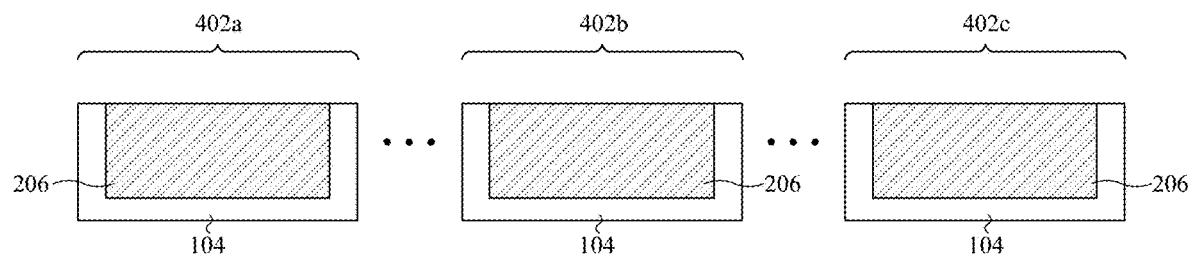
FIGS. 4-23 illustrate a series of cross-sectional views of some embodiments for forming an integrated circuit (IC) comprising a plurality of semiconductor devices, where some of the semiconductor devices have a pair of source/drain regions respectively spaced from a gate electrode by a sidewall spacer and a silicide blocking structure.

As shown in FIG. 4, a second well region 206 is formed in a plurality of regions 402a-c of the semiconductor substrate 104. In some embodiments, the plurality of regions 402a-c of the semiconductor substrate 104 comprises a low-voltage region 402a of the semiconductor substrate 104, a mid-voltage region 402b of the semiconductor substrate 104, and a high-voltage region 402c of the semiconductor substrate 104. In some embodiments, the low-voltage region 402a of the semiconductor substrate 104 may comprise one or more low-voltage MOSFETs. In further embodiments, the mid-voltage region 402b of the semiconductor substrate 104 may comprise one or more mid-voltage MOSFETs. In yet further embodiments, the high-voltage region 402c of the semiconductor substrate 104 may comprise one or more high-voltage MOSFETs.

The second well region 206 is a region of the semiconductor substrate 104 having a first doping type (e.g. n-type doping). In some embodiments, the second well region 206 has a doping type opposite that of adjoining regions of the semiconductor substrate 104. In some embodiments, the second well region 206 may be formed by a blanket ion implantation process (e.g., an unmasked ion implantation) to implant ions into the semiconductor substrate 104, such that the second well region 206 of each of the plurality of regions 402a-c of the semiconductor substrate 104 are part of a single continuous region. In other embodiments, the second well region 206 may be formed by a selective ion implantation process that utilizes a masking layer (not shown) to selectively implant ions into the semiconductor substrate 104, such that the second well region 206 of each of the plurality of regions 402a-c of the semiconductor substrate 104 are discrete regions.

Figure 5:
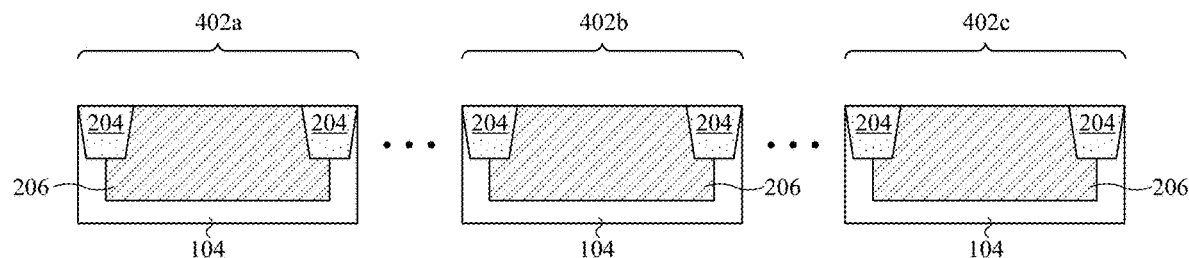

As shown in FIG. 5, an isolation structure 204 is formed in each of the plurality of regions 402a-c of the semiconductor substrate 104. In some embodiments, the isolation structure 204 may be formed by selectively etching the semiconductor substrate 104 to form a trench in the semiconductor substrate 104, and subsequently filing the trench with a dielectric material. In further embodiments, the semiconductor substrate 104 is selectively etched by forming a masking layer (not shown) over the semiconductor substrate 104, and subsequently exposing the semiconductor substrate 104 to an etchant configured to selectively remove unmasked portions of the semiconductor substrate 104. In yet further embodiments, the dielectric material may comprise an oxide (e.g., silicon oxide), a nitride, a carbide, or the like.

Figure 6:
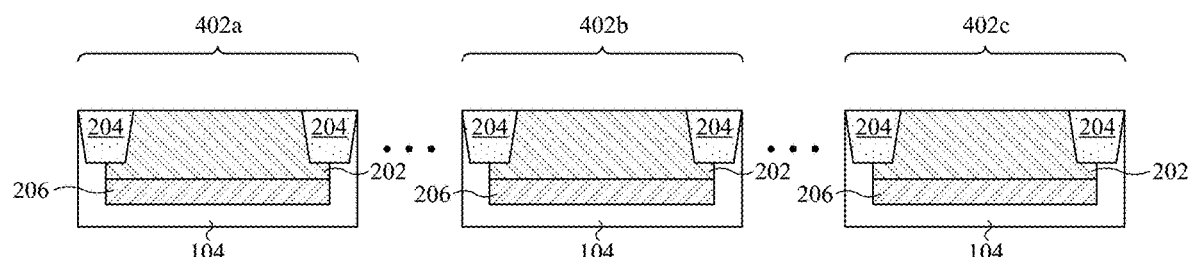

As shown in FIG. 6, a first well region 202 is formed in each of the plurality of regions 402a-c of the semiconductor substrate 104. The first well region 202 is a region of the semiconductor substrate 104 having the first doping type (e.g. n-type doping) or a second doping type (e.g., p-type doping). In some embodiments, the first well region 202 may be formed by a selective ion implantation process that utilizes a masking layer (not shown) to selectively implant ions into the semiconductor substrate 104.

Figure 7:
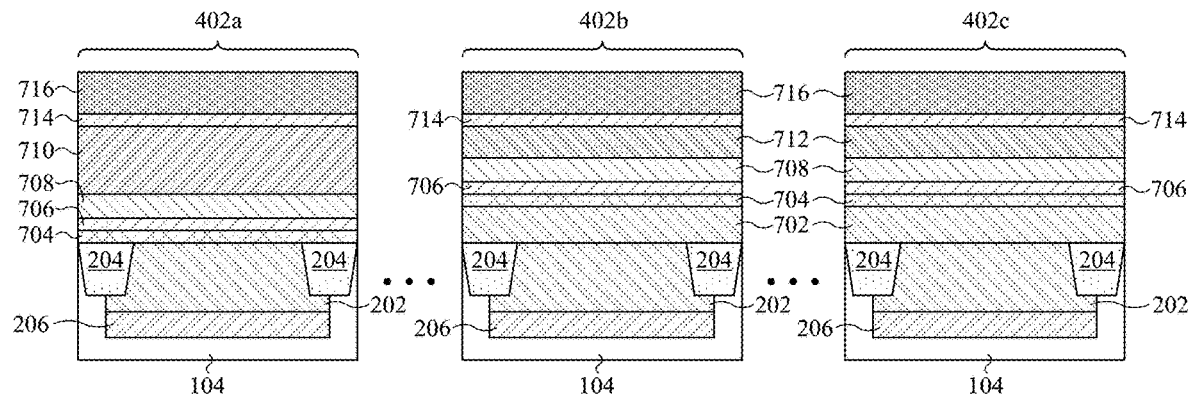

As shown in FIG. 7, a mid-voltage gate dielectric layer 702 is formed over the mid-voltage region 402b of the semiconductor substrate 104 and the high-voltage region 402c of the semiconductor substrate 104. In some embodiments, the mid-voltage gate dielectric layer 702 may comprise silicon dioxide, a high-k dielectric, or some other dielectric. In further embodiments, the mid-voltage gate dielectric layer 702 may have a thickness between about 130 angstroms and about 210 angstroms.

In some embodiments, a process for forming the mid-voltage gate dielectric layer 702 may comprise forming a masking layer (not shown) over the low-voltage region 402a of the semiconductor substrate 104. Subsequently, the mid-voltage gate dielectric layer 702 may be selectively deposited or grown on unmasked portions of the semiconductor substrate 104. In some embodiments, the mid-voltage gate dielectric layer 702 may be deposited or grown by, for example, thermal oxidation, chemical vapor deposition (CVD), physical vapor deposition (PVD), atomic layer deposition (ALD), sputtering, or some other deposition or growth process. Subsequently, in some embodiments, a planarization process (e.g., chemical-mechanical planarization (CMP)) may be performed on the mid-voltage dielectric layer to form a substantially planar upper surface.

Also shown in FIG. 7, a low-voltage gate dielectric layer 704 is formed over the plurality of regions 402a-c of the semiconductor substrate 104. In some embodiments, the low-voltage gate dielectric layer 704 is formed on the low-voltage region 402a of the semiconductor substrate 104. In some embodiments, the low-voltage gate dielectric layer 704 is formed on the mid-voltage gate dielectric layer 702. In further embodiments, the low-voltage gate dielectric layer 704 is a continuous layer that conformally lines the low-voltage region 402a of the semiconductor substrate 104 and the mid-voltage gate dielectric layer 702.

In some embodiments, the low-voltage gate dielectric layer 704 may comprises a high-k dielectric, silicon dioxide, or some other dielectric. In further embodiments, the low-voltage gate dielectric layer 704 may be deposited or grown by, for example, CVD, PVD, ALD, sputtering, or some other deposition or growth process. In yet further embodiments, the process to form the low-voltage gate dielectric layer 704 may be a blanket process (e.g., an unmasked deposition or growth process) or a selective process (e.g., a masked deposition or growth process).

Also shown in FIG. 7, a barrier layer 706 is formed over the plurality of regions 402a-c of the semiconductor substrate 104. In some embodiments, the barrier layer 706 is formed on the low-voltage gate dielectric layer 704. In further embodiments, the barrier layer 706 is a continuous layer that conformally lines the low-voltage gate dielectric layer 704.

In some embodiments, the barrier layer 706 may comprises a nitride, an oxide, a high-k dielectric, or some other dielectric. In some embodiments, the barrier layer 706 may have a thickness of about 20 angstroms. In further embodiments, the barrier layer 706 may be deposited or grown by, for example, CVD, PVD, ALD, sputtering, or some other deposition or growth process. In yet further embodiments, the process to form the barrier layer 706 may be a blanket process or a selective process.

Also shown in FIG. 7, a first gate layer 708 is formed over the plurality of regions 402a-c of the semiconductor substrate 104. In some embodiments, the first gate layer 708 is formed on the barrier layer 706. In further embodiments, the first gate layer 708 is a continuous layer that conformally lines the barrier layer 706.

In some embodiments, the first gate layer 708 may comprise polysilicon, doped polysilicon, a metal, or some other conductor. In some embodiments the first gate layer 708 may have a thickness of about 200 angstroms. In further embodiments, the first gate layer 708 may be deposited or grown by, for example, CVD, PVD, ALD, sputtering, electrochemical plating, electroless plating, or some other deposition or growth process. In yet further embodiments, the process to form the first gate layer 708 may be a blanket process or a selective process.

Also shown in FIG. 7, a second gate layer 710 is formed over the low-voltage region 402a of the semiconductor substrate 104. In some embodiments, the second gate layer 710 is formed on the first gate layer 708. In further embodiments, the second gate layer 710 is not formed on the first gate layer 708 disposed over the mid-voltage region 402b of the semiconductor substrate 104 or the high-voltage region 402c of the semiconductor substrate 104.

In some embodiments, the second gate layer 710 may comprise polysilicon, doped polysilicon, a metal, or some other conductor. In some embodiments the second gate layer 710 may have a thickness of about 480 angstroms. In further embodiments, the second gate layer 710 may be deposited or grown by, for example, CVD, PVD, ALD, sputtering, electrochemical plating, electroless plating, or some other deposition or growth process. In yet further embodiments, the process to form the second gate layer 710 may be a selective process that utilizes a masking layer disposed over the mid-voltage region 402b of the semiconductor substrate 104 and the high-voltage region 402c of the semiconductor substrate 104.

Also shown in FIG. 7, a sealing layer 712 is formed over the mid-voltage region 402b of the semiconductor substrate 104 and the high-voltage region 402c of the semiconductor substrate 104. In some embodiments, the sealing layer 712 is formed on the first gate layer 708. In further embodiments, the sealing layer 712 is not formed on the second gate layer 710.

In some embodiments, the sealing layer 712 may comprise a nitride, an oxide, or some other dielectric. In some embodiments the sealing layer 712 may have a thickness of about 300 angstroms. In further embodiments, the sealing layer 712 may be deposited or grown by, for example, CVD, PVD, ALD, sputtering, or some other deposition or growth process. In yet further embodiments, a process to form the sealing layer 712 may be a selective process that utilizes a masking layer disposed over the low-voltage region 402a of the semiconductor substrate 104. In some embodiments, a planarization process (e.g., CMP) may be performed on the sealing layer 712 and the second gate layer 710 to form a substantially planar upper surface.

Also shown in FIG. 7, a first hard mask layer 714 is formed over the plurality of regions 402a-c of the semiconductor substrate 104. In some embodiments, the first hard mask layer 714 is formed on the second gate layer 710 and the sealing layer 712. In further embodiments, the first hard mask layer 714 is a continuous layer that conformally lines the second gate layer 710 and the sealing layer 712.

In some embodiments, the first hard mask layer 714 may comprise a nitride, an oxide, or some other dielectric. In some embodiments the first hard mask layer 714 may have a thickness of about 100 angstroms. In further embodiments, the first hard mask layer 714 may be deposited or grown by, for example, CVD, PVD, ALD, sputtering, or some other deposition or growth process. In yet further embodiments, a process to form the first hard mask layer 714 may be a blanket process or a selective process. In some embodiments, a planarization process (e.g., CMP) may be performed on the first hard mask layer 714 to form a substantially planar upper surface.

Also shown in FIG. 7, a second hard mask layer 716 is formed over the plurality of regions 402a-c of the semiconductor substrate 104. In some embodiments, the second hard mask layer 716 is formed on the first hard mask layer 714. In further embodiments, the second hard mask layer 716 is a continuous layer that conformally lines the first hard mask layer 714.

In some embodiments, the second hard mask layer 716 may comprise an oxide, a nitride, or some other dielectric. In some embodiments the second hard mask layer 716 may have a thickness of about 900 angstroms. In further embodiments, the second hard mask layer 716 may be deposited or grown by, for example, CVD, PVD, ALD, sputtering, or some other deposition or growth process. In yet further embodiments, the process to form the second hard mask layer 716 may be a blanket process or a selective process. In some embodiments, a planarization process (e.g., CMP) may be performed on the second hard mask layer 716 to form a substantially planar upper surface.

Figure 8:
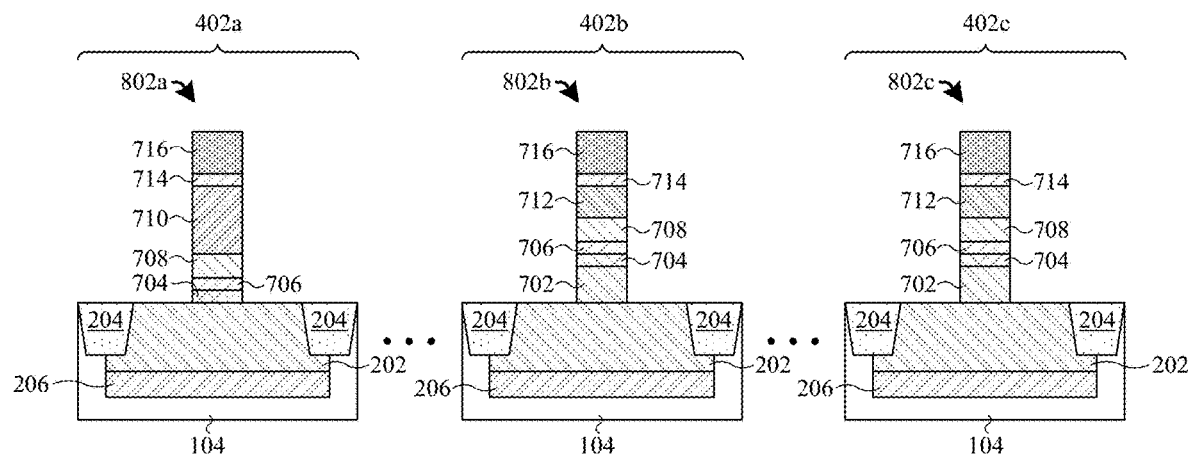

As shown in FIG. 8, the mid-voltage gate dielectric layer 702, the low-voltage gate dielectric layer 704, the barrier layer 706, the first gate layer 708, the second gate layer 710, the sealing layer 712, the first hard mask layer 714, and the second hard mask layer 716 are patterned to form a plurality of initial gate stacks 802a-c respectively disposed over the plurality of regions 402-c of the semiconductor substrate 104. In some embodiments, a first initial gate stack 802a is disposed over the low-voltage region 402a of the semiconductor substrate 104, a second initial gate stack 802b is disposed over the mid-voltage region 402b of the semiconductor substrate 104, and a third initial gate stack 802c is disposed over the high-voltage region 402c of the semiconductor substrate 104. In further embodiments, a plurality of first initial gate stacks 802a may be disposed over the low-voltage region 402a of the semiconductor substrate 104, a plurality of second initial gate stacks 802b may be disposed over the mid-voltage region 402b of the semiconductor substrate 104, and a plurality of third initial gate stacks 802c may be disposed over the high-voltage region 402c of the semiconductor substrate 104.

In some embodiments, a process for forming the plurality of initial gate stacks 802a-c comprises forming a patterned masking layer (not shown) on the second hard mask layer 716. In various embodiments, the patterned masking layer may be formed by a spin on process and patterned using photolithography. In further embodiments, the process comprises performing an etch into the mid-voltage gate dielectric layer 702, the low-voltage gate dielectric layer 704, the barrier layer 706, the first gate layer 708, the second gate layer 710, the sealing layer 712, the first hard mask layer 714, and the second hard mask layer 716 with the patterned masking layer in place, and subsequently stripping the patterned masking layer. In yet further embodiments, the mid-voltage gate dielectric layer 702, the low-voltage gate dielectric layer 704, the barrier layer 706, the first gate layer 708, the second gate layer 710, the sealing layer 712, the first hard mask layer 714, and the second hard mask layer 716 are patterned by a single patterning process. In other embodiments, a plurality of patterning process are performed to pattern the mid-voltage gate dielectric layer 702, the low-voltage gate dielectric layer 704, the barrier layer 706, the first gate layer 708, the second gate layer 710, the sealing layer 712, the first hard mask layer 714, and the second hard mask layer 716.

Figure 9:
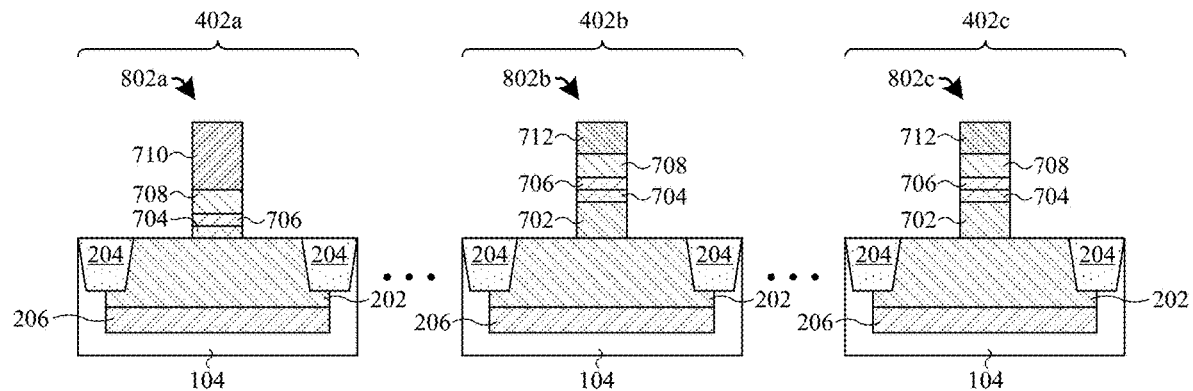

As shown in FIG. 9, the first hard mask layer 714 and the second hard mask layer 716 are removed from the plurality of initial gate stacks 802a-c. In some embodiments, the first hard mask layer 714 and the second hard mask layer 716 may be removed by a selective etching process.

Figure 10:
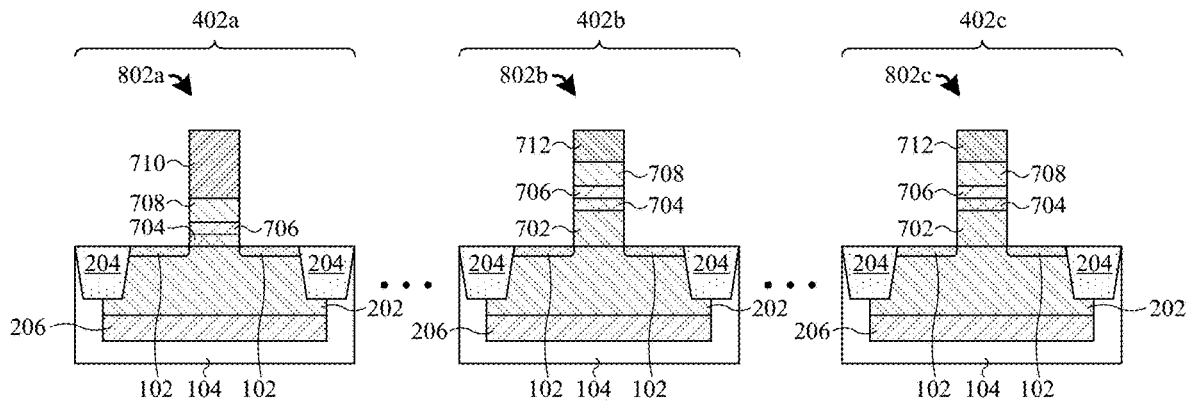

As shown in FIG. 10, a pair of lightly-doped source/drain extensions 102 are formed in each of the plurality of regions 402a-c of the semiconductor substrate 104. The pair of lightly-doped source/drain extensions 102 are disposed in the first well region 202. The lightly-doped source/drain extensions 102 of each pair of lightly-doped source/drain extensions 102 are respectively formed on opposing sides of the initial gate stacks 802a-c. In some embodiments, the lightly-doped source/drain extensions 102 are regions of the semiconductor substrate 104 having a doping type opposite the doping type of the first well region 202 in which they are disposed. In further embodiments, the lightly-doped source/drain extensions 102 may be formed by an ion implantation process and may utilize a masking layer (not shown) to selectively implant ions into the semiconductor substrate 104. In yet further embodiments, the lightly-doped source/drain extensions 102 may be formed by a self-aligned ion implantation process that utilizes the initial gate stacks 802a-c as a masking layer.

Figure 11:
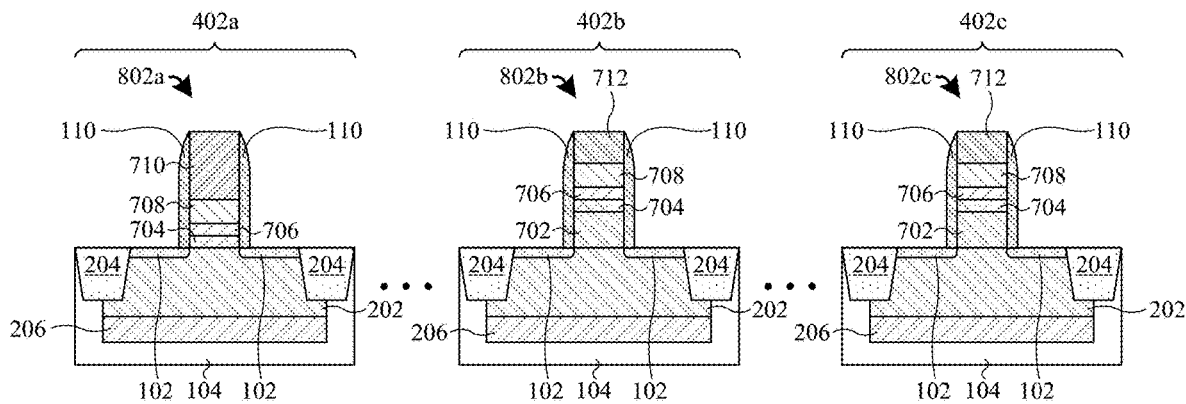

As shown in FIG. 11, sidewall spacers 110 are formed over the semiconductor substrate 104 and along sides of the initial gate stacks 802a-c. In some embodiments, the sidewall spacers 110 may be formed by depositing a spacer layer over the semiconductor substrate 104 and the initial gate stacks 802a-c. In further embodiments, the spacer layer may be deposited by PVD, CVD, ALD, sputtering, or some other deposition process. In yet further embodiments, the spacer layer is subsequently etched to remove the spacer layer from horizontal surfaces, leaving the spacer layer along opposing sides of initial gate stacks 802a-c, as the sidewall spacers 110. In various embodiments, the spacer layer may comprise a nitride, an oxide, or some other dielectric. In further embodiments, the sidewall spacers may have a thickness of greater than or equal to about 0.018 µm. In yet further embodiments, the sidewall spacers 110 may be formed prior to forming the lightly-doped source/drain extensions 102. In such embodiments, the lightly-doped source/drain extensions 102 may be formed using an angled ion implantation process.

Figure 12:
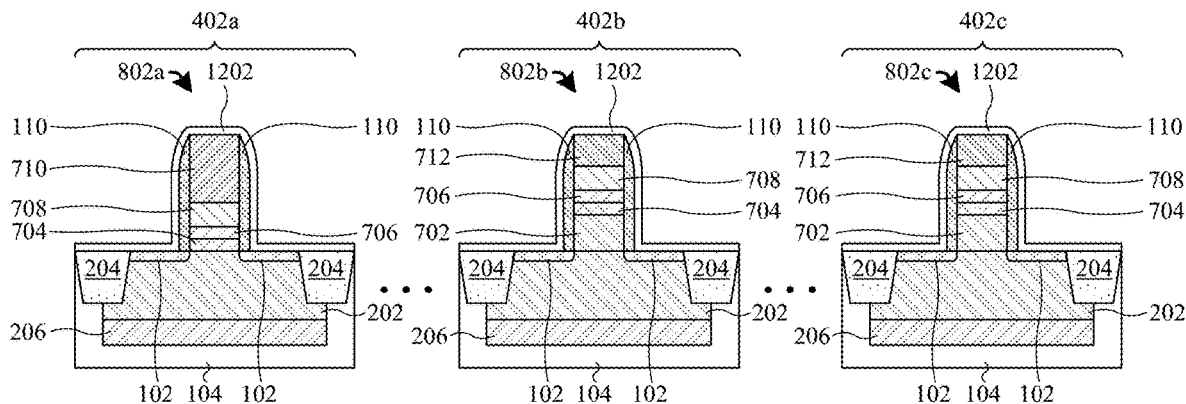

As shown in FIG. 12, a silicide blocking layer 1202 is formed over the semiconductor substrate 104, the sidewall spacers 110, and the initial gate stacks 802a-c. In some embodiments, the silicide blocking layer 1202 is a continuous layer that conformal lines the semiconductor substrate, the sidewall spacers 110, and the initial gate stacks 802a-c. In further embodiments, the silicide blocking layer 1202 may be deposited by PVD, CVD, ALD, sputtering, or some other deposition process. In some embodiments, the silicide blocking layer 1202 is not formed over the low-voltage region 402a of the semiconductor substrate 104 (e.g., by utilizing a masking layer). In yet further embodiments, the silicide blocking layer 1202 may have a thickness greater than or equal to about 0.015 µm. In some embodiments, the silicide blocking structure 112 may comprise an oxide, a nitride, an oxy-nitride, or the like.

Figure 13:
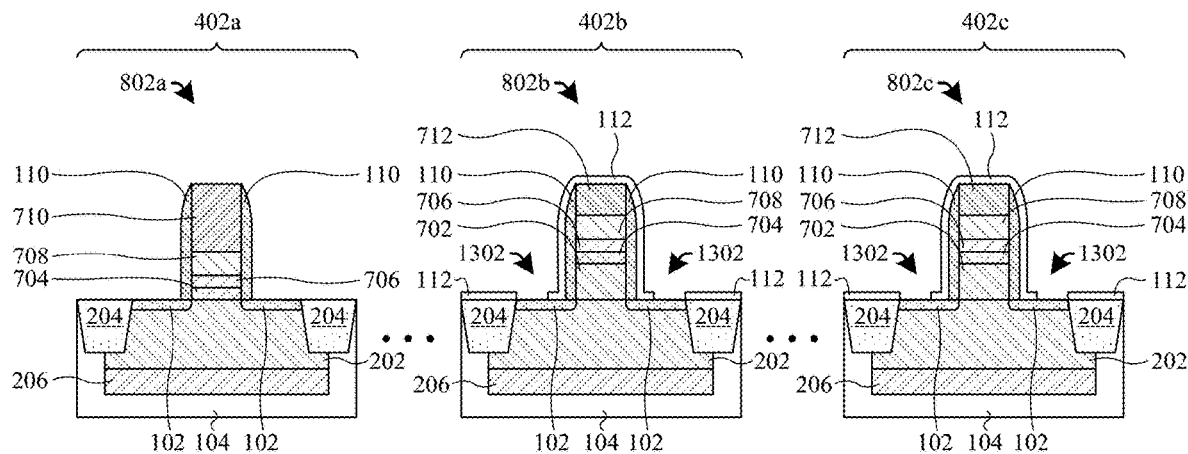

As shown in FIG. 13, the silicide blocking layer 1202 disposed over the low-voltage region 402a of the semiconductor substrate 104 is removed. Further, silicide blocking layer openings 1302 are formed in the silicide blocking layer 1202 disposed over the mid-voltage region 402b of the semiconductor substrate 104 and the high-voltage region 402c, such that silicide blocking structures 112 are formed. In some embodiments, a process for removing the silicide blocking layer 1202 disposed over the low-voltage region 402a of the semiconductor substrate 104 and forming the silicide blocking layer openings 1302 in the silicide blocking layer 1202 comprises forming a patterned masking layer (not shown) on the silicide blocking layer 1202. In further embodiments, the process comprises performing an etch into silicide blocking layer 1202 with the patterned masking layer in place, and subsequently stripping the patterned masking layer. In yet further embodiments, a single etch is performed to remove the silicide blocking layer 1202 disposed over the low-voltage region 402a of the semiconductor substrate 104 and forming the silicide blocking layer openings 1302 in the silicide blocking layer 1202.

In some embodiments, a plurality of patterning processes are performed to remove the silicide blocking layer 1202 disposed over the low-voltage region 402a of the semiconductor substrate 104 and to form the silicide blocking layer openings 1302 in the silicide blocking layer 1202. For example, a first patterned masking layer (not shown) may be formed on the silicide blocking layer 1202, and a first etch may be performed into the silicide blocking layer 1202 with the first patterned masking layer in place to remove the silicide blocking layer 1202 disposed over the low-voltage region 402a. Subsequently, a second patterned masking layer (not shown) may be formed on the silicide blocking layer 1202, and a second etch may be performed into the silicide blocking layer 1202 with the second patterned masking layer in place to form the silicide blocking layer openings 1302 in the silicide blocking layer 1202. In further embodiments, the silicide blocking layer 1202 disposed over the low-voltage region 402a may be removed before the silicide blocking layer openings 1302 are formed in the silicide blocking layer 1202. In other embodiments, the silicide blocking layer 1202 disposed over the low-voltage region 402a may be removed after the silicide blocking layer openings 1302 are formed in the silicide blocking layer 1202.

Figure 14:
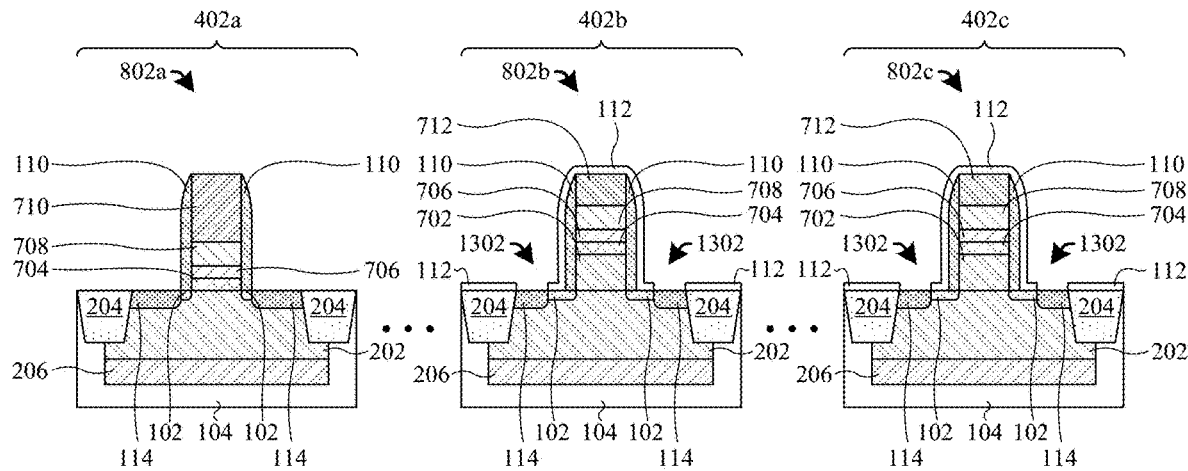

As shown in FIG. 14, a pair of source/drain regions 114 are formed in each of the plurality of regions 402a-c of the semiconductor substrate 104. The source/drain regions 114 formed in the low-voltage region 402a of the semiconductor substrate 104 are respectively formed on sides of the first initial gate stack 802a. In some embodiments, the source/drain regions 114 formed in the low-voltage region 402a of the semiconductor substrate 104 respectively comprise sides facing the first initial gate stack 802a that are substantially aligned with sides of the sidewall spacers 110 disposed on opposing sides of the first initial gate stack 802a.

The source/drain regions 114 formed in the mid-voltage region 402b of the semiconductor substrate 104 and the high-voltage region 402c of the semiconductor substrate 104 are formed through the silicide blocking layer openings 1302. In some embodiments, the source/drain regions 114 formed in the mid-voltage region 402b of the semiconductor substrate 104 respectively comprise sides facing the second initial gate stack 802b that are substantially aligned with sides of the silicide blocking structures 112. In further embodiments, the source/drain regions 114 formed in the high-voltage region 402c of the semiconductor substrate 104 respectively comprise sides facing the third initial gate stack 802c that are substantially aligned with sides of the silicide blocking structures 112.

The source/drain regions 114 are regions of the semiconductor substrate 104 having a doping type opposite the doping type of the first well region 202 in which they are disposed. In some embodiments, the source/drain regions 114 respectively adjoin the lightly-doped source/drain extensions 102. In some embodiments, the source/drain regions 114 comprise the same doping type as adjoining lightly-doped source/drain regions 102. In various embodiments, the source/drain regions 114 may be formed by an ion implantation process and may utilize the silicide blocking structures 112, the first initial gate stack 802a, and the sidewall spacers 110 disposed on opposing sides of the first initial gate stack 802a as a masking layer to selectively implant ions into the semiconductor substrate 104. In other embodiments, a masking layer (not shown) may be utilized over the low-voltage region 402a of the semiconductor substrate 104 in conjunction with the silicide blocking structures 112 to selectively implant ions into the semiconductor substrate 104. In some embodiments, an anneal process (e.g., laser anneal, rapid thermal anneal (RTA), etc.) is performed after the source/drain regions 114 are formed to activate the source/drain regions 114.

Figure 15:
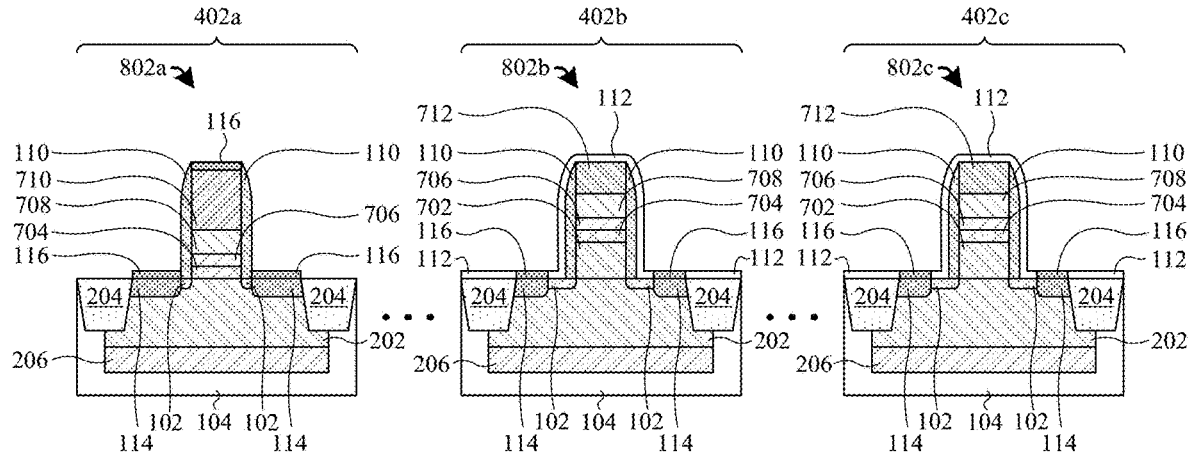

As shown in FIG. 15, silicide structures 116 are formed over the source/drain regions 114. In some embodiment, a silicide structure 116 may be formed over the second gate layer 710 of the first initial gate stack 802a. In other embodiments, a silicide structure 116 may not be formed over the second gate layer 710 of the first initial gate stack 802a. In various embodiments, a process for forming the silicide structures 116 comprises depositing a metal layer (not shown) over the semiconductor substrate 104. In some embodiments, the metal layer may comprise, for example, nickel, titanium, cobalt, tungsten, or some other electropositive element. An anneal process is performed with the metal layer in place, such that the metal layer reacts with exposed portions of polysilicon to form the silicide structures 116. Subsequently, the non-reacted portions of the metal layer are stripped away. In further embodiments, a masking layer (not shown) is deposited before the metal layer to selectively prevent the metal layer from reacting with portions of polysilicon.

Figure 16:
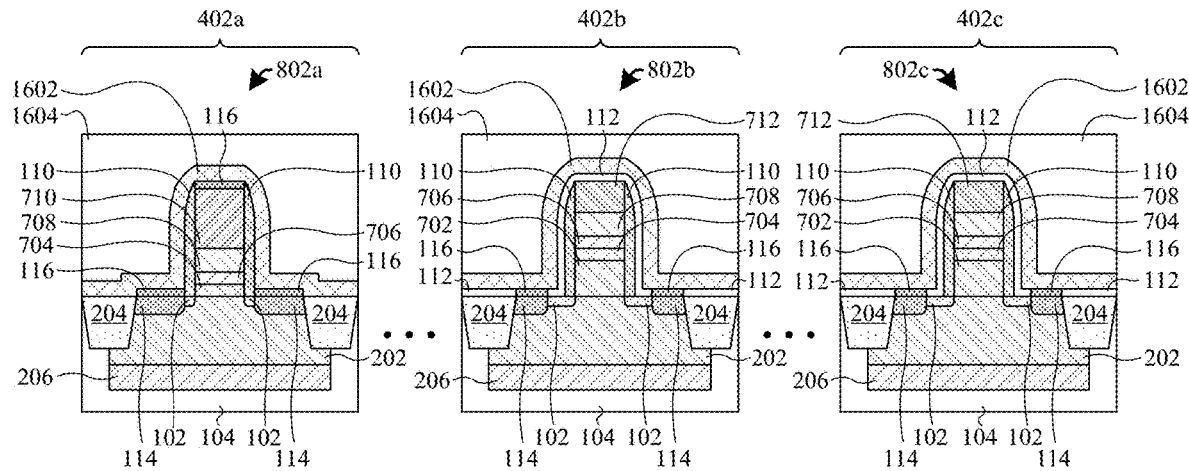

As shown in FIG. 16, a contact etch stop layer (CESL) 1602 is formed over the semiconductor substrate 104, the silicide structures 116, the sidewall spacers 110, and the initial gate stacks 802a-c. In some embodiments, the CESL may be formed as a continuous layer that conformally lines the semiconductor substrate 104, the silicide structures 116, the sidewall spacers 110, and the initial gate stacks 802a-c. In further embodiments, the CESL 1602 may comprise, for example, a nitride, an oxide, a carbide, or some other suitable dielectric. In some embodiments, the CESL 1602 may be formed by, for example, CVD, PVD, ALD, sputtering, or some other deposition process.

Also shown in FIG. 16, a first interlayer dielectric (ILD) layer 1604 is formed over the CESL 1602. In some embodiments, the first ILD layer 1604 may comprise, for example, an oxide, a low κ dielectric, or some other suitable dielectric. In further embodiments, the first ILD layer 1604 may be deposited by, for example, CVD, PVD, ALD, sputtering, or some other deposition process. In yet further embodiments, a planarization process (e.g., CMP) may be performed on the first ILD layer 1604 to form a substantially planar upper surface.

Figure 17:
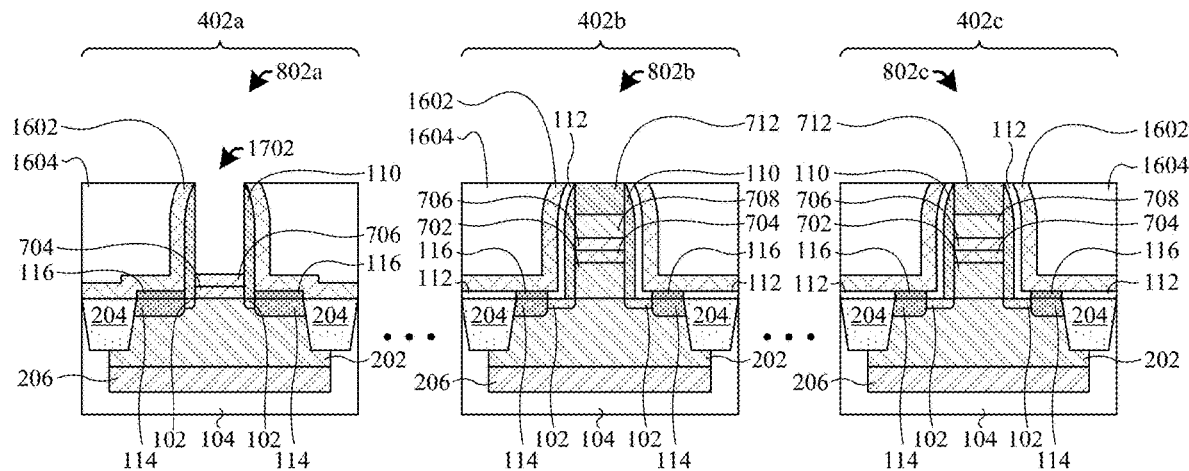

As shown in FIG. 17, portions of the first ILD layer 1604, portions of the CESL 1602, and portions of the silicide blocking structures 112 are removed to expose upper surfaces of the initial gate stacks 802a-c. Further, a low-voltage gate electrode opening 1702 is formed over the low-voltage region 402a of the semiconductor substrate 104 by removing the second gate layer 710 disposed in the first initial gate stack 802a and the first gate layer 708 disposed in the first initial gate stack 802a. In some embodiments, portions of the first ILD layer 1604, portions of the CESL 1602, and portions of the silicide blocking structures 112 may be removed by, for example, CMP, a dry/wet etch process, or some other removal process. In further embodiments, the low-voltage gate electrode opening 1702 may be removed by, for example, a dry/wet etch process. In yet further embodiments, a masking layer (not shown) may be formed over the first ILD layer 1604 to selectively remove the second gate layer 710 disposed in the first initial gate stack 802a and the first gate layer 708 disposed in the first initial gate stack 802a.

Figure 18:
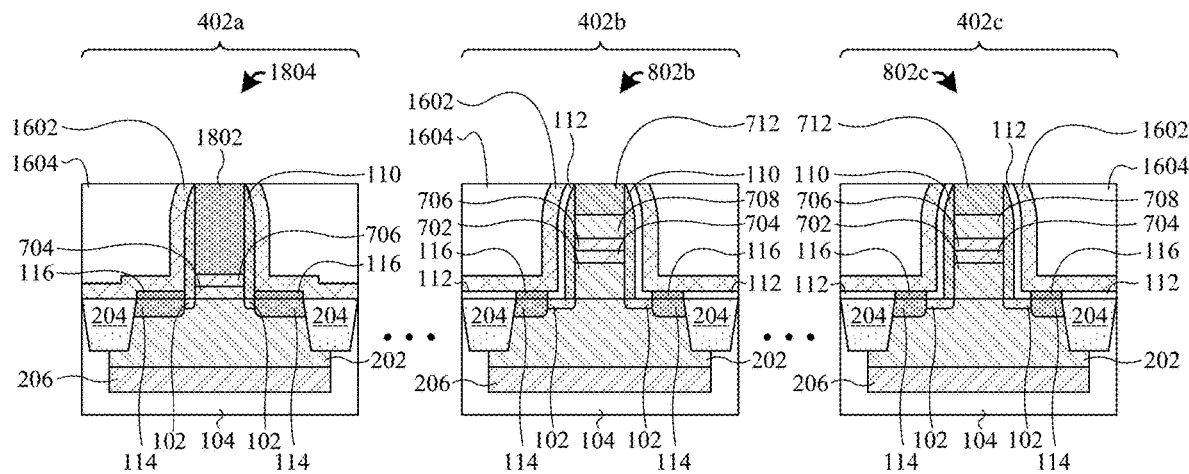

As shown in FIG. 18, a low-voltage gate electrode 1802 is formed in the low-voltage gate electrode opening 1702. In some embodiments, the low-voltage gate electrode 1802 may be a metal gate that comprises, for example, aluminum, copper, titanium, tantalum, tungsten, molybdenum, cobalt, or the like. In further embodiments, a process for forming the low-voltage gate electrode 1802 comprises selectively forming a masking layer (not shown) over the first ILD layer 1604. Subsequently, the low-voltage gate electrode 1802 may be selectively deposited in the low-voltage gate electrode opening 1702 by, for example, ALD, CVD, PVD, sputtering, electroless plating, electroplating, or some other deposition process. After the low-voltage gate electrode 1802 is deposited in the low-voltage gate electrode opening 1702, a planarization process (e.g., chemical-mechanical planarization (CMP)) may be performed on the low-voltage gate electrode 1802 to form a substantially planar upper surface. In yet further embodiments, the mid-voltage gate electrode 1802, the barrier layer 706 disposed over the low-voltage region 402a of the semiconductor substrate 104, and the low-voltage gate dielectric layer 702 disposed over the low-voltage region 402a of the semiconductor substrate 104 may define a low-voltage gate stack 1804.

Figure 19:
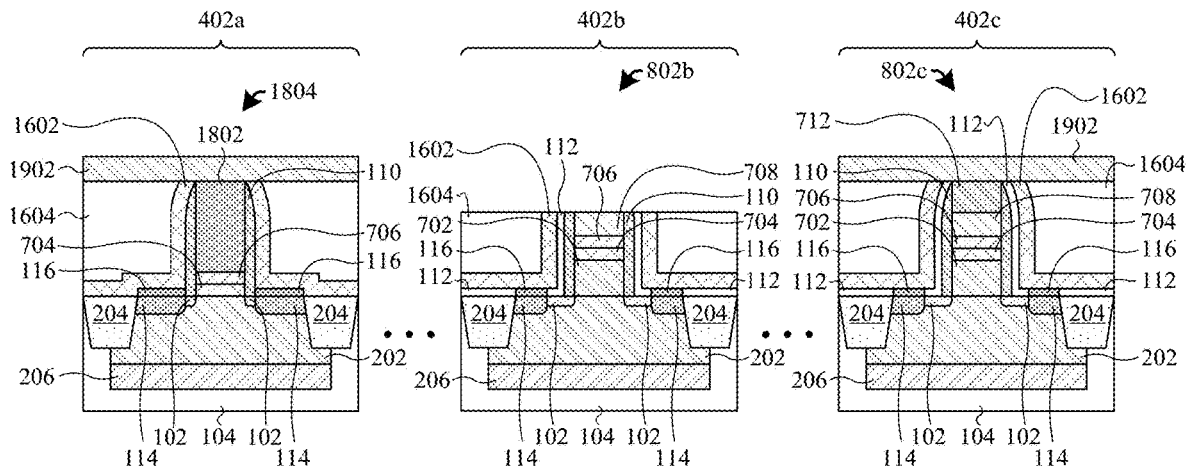

As shown in FIG. 19, a mid-voltage removal masking layer 1902 is formed over the low-voltage region 402a of the semiconductor substrate 104 and the high-voltage region 402c of the semiconductor substrate 104. In some embodiments, the mid-voltage removal masking layer 1902 may be formed by, for example, a spin on process and patterned using photolithography.

Also shown in FIG. 19, portions of the first ILD layer 1604, portions of the CESL 1602, portions of the silicide blocking structures 112, and portions of the sidewall spacers 110 that are disposed over the mid-voltage region 402b of the semiconductor substrate 104 are removed. Further, the sealing layer 712 disposed over the mid-voltage region 402b of the semiconductor substrate 104 is removed. In some embodiments, a process for removing the portions of the first ILD layer 1604, the portions of the CESL 1602, the portions of the silicide blocking structures 112, the portions of the sidewall spacers 110, and the sealing layer 712 disposed over the mid-voltage region 402b of the semiconductor substrate 104 comprises performing an etch with the mid-voltage removal masking layer 1902 in place. In further embodiments, a single etch is performed to remove the portions of the first ILD layer 1604, the portions of the CESL 1602, the portions of the silicide blocking structures 112, the portions of the sidewall spacers 110, and the sealing layer 712 disposed over the mid-voltage region 402b of the semiconductor substrate 104. In yet further embodiments, a plurality of etches are performed to remove the portions of the first ILD layer 1604, the portions of the CESL 1602, the portions of the silicide blocking structures 112, the portions of the sidewall spacers 110, and the sealing layer 712 disposed over the mid-voltage region 402b of the semiconductor substrate 104.

Figure 20:
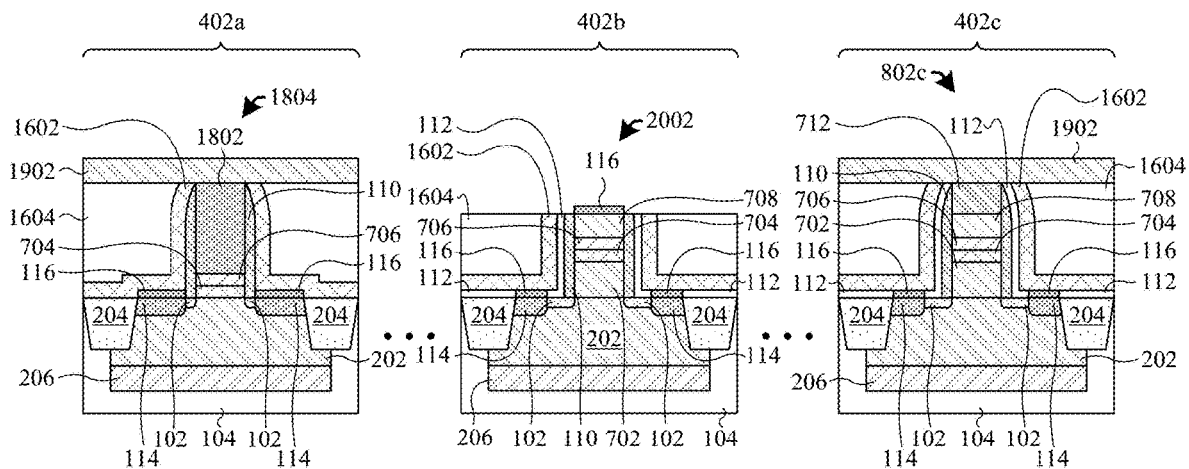

As shown in FIG. 20, a silicide structure 116 is formed over the first gate layer 708 that is disposed over the mid-voltage region 402b of the semiconductor substrate 104. In some embodiments, the silicide structure 116 formed over the first gate layer 708 has a bottom surface that contacts the barrier layer 706. In various embodiments, a process for forming the silicide structure 116 comprises depositing a metal layer (not shown) over the semiconductor substrate 104. In some embodiments, the metal layer may comprise, for example, nickel, titanium, cobalt, tungsten, or some other electropositive element. An anneal process is performed with the metal layer in place, such that the metal layer reacts with the first gate layer 708 to form the silicide structure 116. Subsequently, the non-reacted portions of the metal layer are stripped away. In further embodiments, the silicide structure 116 formed over the first gate layer 708, the first gate layer 708 disposed over the mid-voltage region 402b of the semiconductor substrate 104, the barrier layer 706 disposed over the mid-voltage region 402b of the semiconductor substrate 104, the low-voltage gate dielectric layer 704 disposed over the mid-voltage region 402b of the semiconductor substrate 104, and the mid-voltage gate dielectric layer 702 disposed over the mid-voltage region 402b of the semiconductor substrate 104 may define a mid-voltage gate stack 2002.

Figure 21:
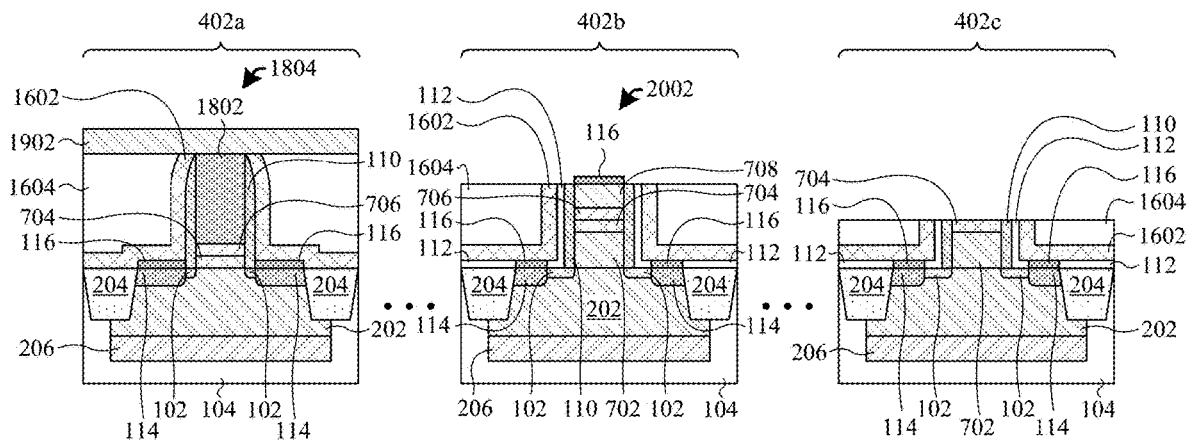

As shown in FIG. 21, portions of the first ILD layer 1604, portions of the CESL 1602, portions of the silicide blocking structures 112, and portions of the sidewall spacers 110 that are disposed over the high-voltage region 402c of the semiconductor substrate 104 are removed. Further, the sealing layer 712, the first gate layer 708, and the barrier layer 706 disposed over the high-voltage region 402c of the semiconductor substrate 104 are removed.

In some embodiments, a process for removing the portions of the first ILD layer 1604, portions of the CESL 1602, portions of the silicide blocking structures 112, portions of the sidewall spacers 110, the sealing layer 712, the first gate layer 708, and the barrier layer 706 disposed over the high-voltage region 402c of the semiconductor substrate 104 comprises forming a patterned masking layer (not shown) over the mid-voltage region 402b of the semiconductor substrate 104. In further embodiments, the process comprises performing an etch with the patterned masking layer in place, and subsequently stripping the patterned masking layer. In yet further embodiments, a single etch is performed to remove the portions of the first ILD layer 1604, portions of the CESL 1602, portions of the silicide blocking structures 112, portions of the sidewall spacers 110, the sealing layer 712, the first gate layer 708, and the barrier layer 706 disposed over the high-voltage region 402c of the semiconductor substrate 104. In yet further embodiments, a plurality of etches are performed to remove the portions of the first ILD layer 1604, portions of the CESL 1602, portions of the silicide blocking structures 112, portions of the sidewall spacers 110, the sealing layer 712, the first gate layer 708, and the barrier layer 706 disposed over the high-voltage region 402c of the semiconductor substrate 104.

Figure 22:
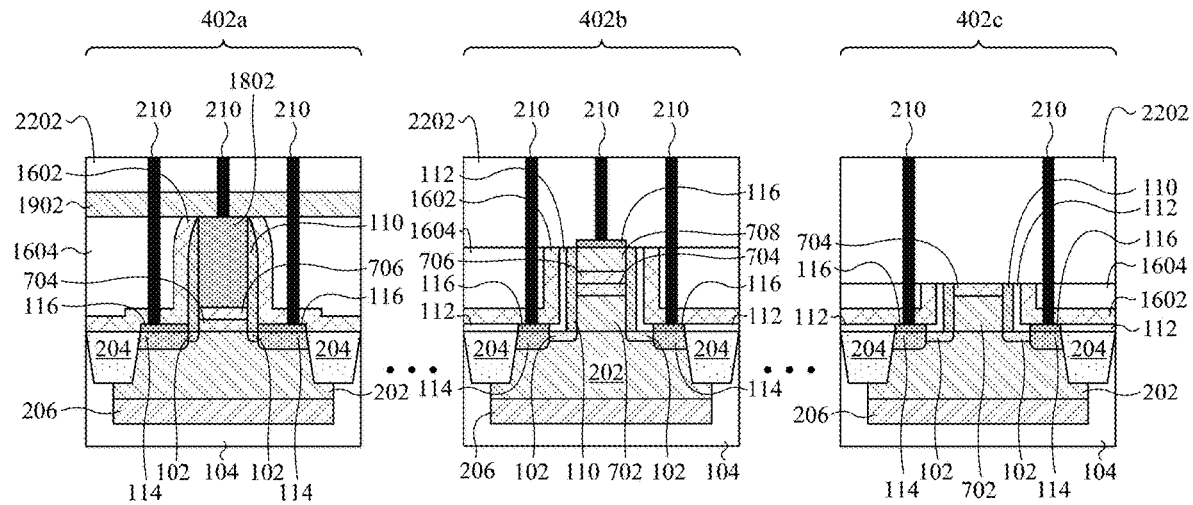

As shown in FIG. 22, a second ILD layer 2202 is formed over the structure of FIG. 21. In some embodiments, the second ILD layer 2202 may comprise, for example, an oxide, a low κ dielectric, or some other suitable dielectric. In further embodiments, the second ILD layer 2202 may be deposited by, for example, CVD, PVD, ALD, sputtering, or some other deposition process. In yet further embodiments, a planarization process (e.g., CMP) may be performed on the second ILD layer 2202 to form a substantially planar upper surface.

Also shown in FIG. 22, conductive contacts 210 are formed in the second ILD layer 2202. In some embodiments, the conductive contacts 210 disposed over the low-voltage region 402a of the semiconductor substrate 104 extend through the second ILD layer 2202, the mid-voltage removal masking layer 1902, and the first ILD layer 1604 to respectively contact the silicide structures 116 disposed over the low-voltage region 402a of the semiconductor substrate 104 and the low-voltage gate electrode 1802. In further embodiments, the conductive contacts 210 disposed over the mid-voltage region 402b of the semiconductor substrate 104 extend through the second ILD layer 2202 and the first ILD layer 1604 to respectively contact the silicide structures 116 disposed over the mid-voltage region 402b of the semiconductor substrate 104. In yet further embodiments, the conductive contacts 210 disposed over the high-voltage region 402c of the semiconductor substrate 104 extend through the second ILD layer 2202 and the first ILD layer 1604 to respectively contact the silicide structures 116 disposed over the high-voltage region 402c of the semiconductor substrate 104.

In some embodiments, a process for forming the conductive contacts 210 comprises forming a masking layer covering the second ILD layer 2202. The masking layer is patterned with a layout of the conductive contacts 210, and an etch is performed into the second ILD layer 2202, the mid-voltage removal masking layer 1902, and the first ILD layer 1604 with the patterned masking layer in place to form contact openings corresponding to the conductive contacts 210. The patterning may be, for example, performed by photolithography or some other patterning process. A conductive layer is then deposited covering the second ILD layer 2202 and filling the contact openings, and a planarization process is performed into the conductive layer until the second ILD layer 2202 is reached. The conductive layer may be deposited by, for example, CVD, PVD, ALD, sputtering, electroless plating, electroplating, or some other deposition or plating process. The planarization process may be, for example, a CMP process or some other suitable planarization process. In various embodiments, the process may be part of a single damascene like process or a dual damascene like process.

Figure 23:
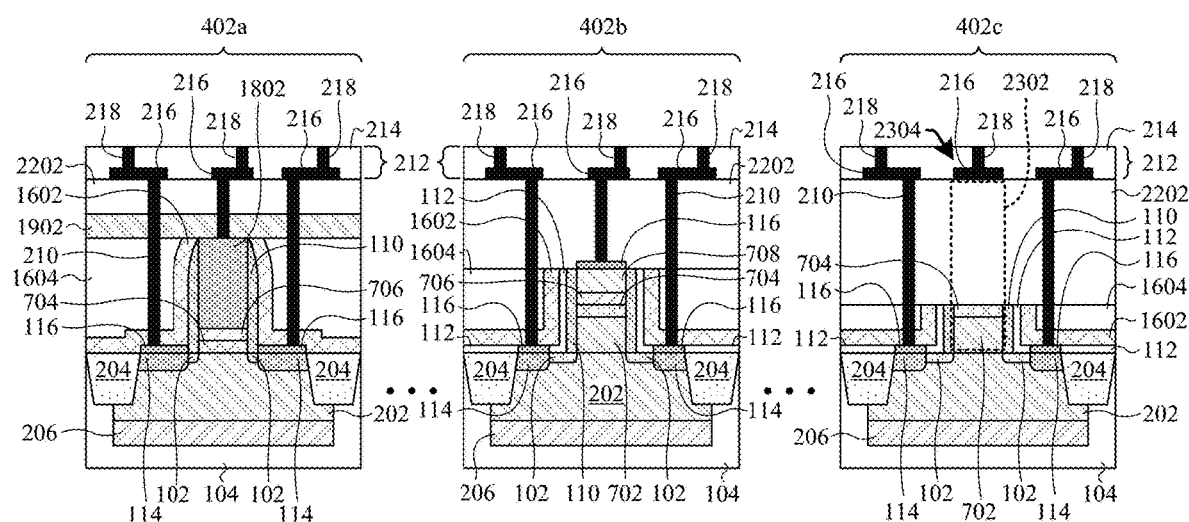

As shown in FIG. 23, an inter-metal dielectric (IMD) layer 214 is formed over the second ILD layer 2202. In some embodiments, the IMD layer 214 may comprise, for example, an oxide, a low κ dielectric, or some other suitable dielectric. In further embodiments, the IMD layer 214 may be deposited by, for example, CVD, PVD, ALD, sputtering, or some other deposition process. In yet further embodiments, a planarization process (e.g., CMP) may be performed on the IMD layer 214 to form a substantially planar upper surface.

Also shown in FIG. 23, a plurality of conductive lines 216 and conductive vias 218 are formed in the IMD layer 214. In some embodiments, the IMD layer 214, the conductive lines, 216, and the conductive vias 218 may define an interconnect structure 212. In some embodiments, a process for forming the conductive lines 216 and the conductive vias 218 in the IMD layer 214 comprises performing an etch into the IMD layer 214 to form via openings and conductive line openings that respectively correspond to the conductive vias 218 and the conductive lines 216. In some embodiments, the etch may be performed with a patterned masking layer formed over the IMD layer 214. In further embodiments, the process comprises filling the openings with a conductive material. In yet further embodiments, the openings may be filled by depositing or growing a conductive layer covering the IMD layer 214 that fills the openings, and subsequently performing a planarization (e.g., CMP) on the IMD layer 214. In various embodiments, the process may be part of a single damascene like process or a dual damascene like process.

Also shown in FIG. 23, one of the conductive lines 216 disposed in the IMD layer 214 over the high-voltage region 402c of the semiconductor substrate 104 is also disposed between the source/drain regions 114 disposed in the high-voltage region 402c of the semiconductor substrate 104. In some embodiments, this conductive line 216 may be a gate electrode for a high-voltage MOSFET. In such an embodiment, a region of the second ILD layer 2202 disposed over the high-voltage region 402c of the semiconductor substrate 104, the barrier layer 706 disposed over the high-voltage region 402c of the semiconductor substrate 104, and the mid-voltage gate dielectric layer 702 disposed over the high-voltage region 402c of the semiconductor substrate 104 may be a high-voltage gate dielectric 2302. In further embodiments, the one of the conductive lines 216 disposed in the IMD layer 214 over the high-voltage region 402c of the semiconductor substrate 104 and the high-voltage gate dielectric 2302 may define a high-voltage gate stack 2304.

Figure 24:
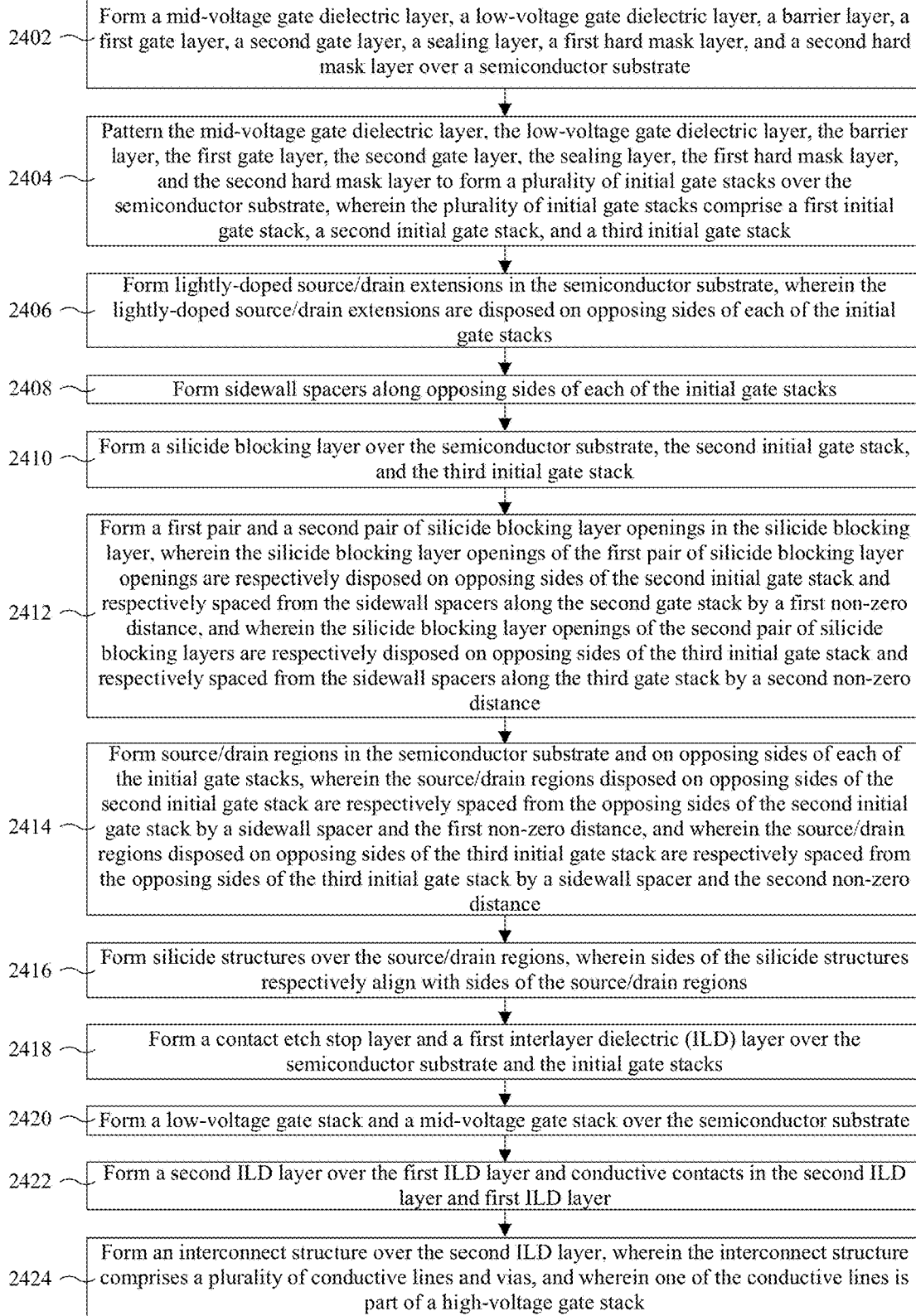
FIG. 24 illustrates a flowchart of some embodiments of a method for forming an integrated circuit (IC) comprising a plurality of semiconductor devices, where some of the semiconductor devices have a pair of source/drain regions respectively spaced from a gate electrode by a sidewall spacer and a silicide blocking structure.

As illustrated in FIG. 24, a flowchart 2400 of some embodiments of a method for forming an integrated circuit (IC) comprising a plurality of semiconductor devices, where some of the semiconductor devices have a pair of source/drain regions respectively spaced from a gate electrode by a sidewall spacer and a silicide blocking structure is provided. While the flowchart 2400 of FIG. 24 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 2402, a mid-voltage gate dielectric layer, a low-voltage gate dielectric layer, a barrier layer, a first gate layer, a second gate layer, a sealing layer, a first hard mask layer, and a second hard mask layer are formed over a semiconductor substrate. FIGS. 4-7 illustrate cross-sectional views of some embodiments corresponding to act 2402.

At 2404, the mid-voltage gate dielectric layer, the low-voltage gate dielectric layer, the barrier layer, the first gate layer, the second gate layer, the sealing layer, the first hard mask layer, and the second hard mask layer are patterned to form a plurality of initial gate stacks over the semiconductor substrate, where the plurality of initial gate stacks comprise a first initial gate stack, a second initial gate stack, and a third initial gate stack. FIG. 8 illustrates a cross-sectional view of some embodiments corresponding to act 2404.

At 2406, lightly-doped source/drain extensions are formed in the semiconductor substrate, where the lightly-doped source/drain extensions are disposed on opposing sides of each of the initial gate stacks. FIGS. 9-10 illustrate cross-sectional views of some embodiments corresponding to act 2406.

At 2408, sidewall spacers are formed along opposing sides of each of the initial gate stacks. FIG. 11 illustrates a cross-sectional view of some embodiments corresponding to act 2408.

At 2410, a silicide blocking layer is formed over the semiconductor substrate, the second initial gate stack, and the third initial gate stack. FIG. 12 illustrates a cross-sectional view of some embodiments corresponding to act 2410.

At 2412, a first pair and a second pair of silicide blocking layer openings are formed in the silicide blocking layer, where the silicide blocking layer openings of the first pair of silicide blocking layer openings are respectively disposed on opposing sides of the second initial gate stack and respectively spaced from the sidewall spacers along the second gate stack by a first non-zero distance, and where the silicide blocking layer openings of the second pair of silicide blocking layers are respectively disposed on opposing sides of the third initial gate stack and respectively spaced from the sidewall spacers along the third gate stack by a second non-zero distance. FIG. 13 illustrates a cross-sectional view of some embodiments corresponding to act 2412.

At 2414, source/drain regions are formed in the semiconductor substrate and on opposing sides of each of the initial gate stacks, where the source/drain regions disposed on opposing sides of the second initial gate stack are respectively spaced from the opposing sides of the second initial gate stack by a sidewall spacer and the first non-zero distance, and where the source/drain regions disposed on opposing sides of the third initial gate stack are respectively spaced from the opposing sides of the third initial gate stack by a sidewall spacer and the second non-zero distance. FIG. 14 illustrates a cross-sectional view of some embodiments corresponding to act 2414.

At 2416, silicide structures are formed over the source/drain regions, where sides of the silicide structures respectively align with sides of the source/drain regions. FIG. 15 illustrates a cross-sectional view of some embodiments corresponding to act 2416.

At 2418, a contact etch stop layer and a first interlayer dielectric (ILD) layer are formed over the semiconductor substrate and the initial gate stacks. FIG. 16 illustrates a cross-sectional view of some embodiments corresponding to act 2418.

At 2420, a low-voltage gate stack and a mid-voltage gate stack are formed over the semiconductor substrate. FIGS. 17-21 illustrate cross-sectional views of some embodiments corresponding to act 2420.

At 2422, a second ILD layer is formed over the first ILD layer and conductive contacts are formed in the second ILD layer and first ILD layer. FIG. 22 illustrates a cross-sectional view of some embodiments corresponding to act 2422.

At 2424, an interconnect structure is formed over the second ILD layer, where the interconnect structure comprises a plurality of conductive lines and vias, and where one of the conductive lines is part of a high-voltage gate stack. FIG. 23 illustrates a cross-sectional view of some embodiments corresponding to act 2424.

In some embodiments, the present application provides a semiconductor device. The semiconductor device includes a pair of source/drain regions disposed in a semiconductor substrate, where the source/drain regions are laterally spaced. A gate electrode is disposed over the semiconductor substrate between the source/drain regions. Sidewall spacers are disposed over the semiconductor substrate on opposite sides of the gate electrode. A silicide blocking structure is disposed over the sidewall spacers. Respective sides of the source/drain regions facing the gate electrode are spaced apart from outer sides of the sidewall spacers and are substantially aligned with outer sidewalls of the silicide blocking structure.

In other embodiments, the present application provides a semiconductor device. The semiconductor device includes a first source/drain region and a second source/drain region disposed in a semiconductor substrate, where the first source/drain region is laterally spaced from the second source/drain region. A gate dielectric layer is disposed over the semiconductor substrate between the first source/drain region and the second source/drain region. A gate electrode is disposed over the gate dielectric. A first sidewall spacer is disposed over the semiconductor substrate on a first side of the gate electrode. A first silicide blocking structure is disposed over the first sidewall spacer. The first silicide blocking structure extends vertically from the semiconductor substrate along an outer side of the first sidewall spacer, and the first silicide blocking structure extends laterally over the semiconductor substrate by a first non-zero distance. A first silicide structure is disposed over the first source/drain region. The first silicide blocking structure separates the first silicide structure from the first sidewall spacer by the first non-zero distance.

In yet other embodiments, the present application provides a method for forming a semiconductor device. The method for forming the semiconductor device includes forming a gate electrode and a gate dielectric stacked over a semiconductor substrate. A first sidewall spacer is formed over the semiconductor substrate on a first side of the gate electrode, and a second sidewall spacer is formed over the semiconductor substrate on a second side of the gate electrode opposite the first side of the gate electrode. A silicide blocking layer is formed is formed over the first sidewall spacer, the second sidewall spacer, the gate electrode, and the semiconductor substrate. A first opening is formed in the silicide blocking layer on the first side of the gate electrode, where the first opening has a first sidewall that is spaced from an outer side of the first sidewall spacer. A second opening is formed in the silicide blocking layer on the second side of the gate electrode, where the second opening has a second sidewall that is spaced from an outer side of the second sidewall spacer. A pair of source/drain regions are formed in the semiconductor substrate. The source/drain regions are respectively disposed on the first side of the gate electrode and the second side of the gate electrode. Respective sides of the source/drain regions facing the gate electrode are substantially aligned with the first sidewall and the second sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a pair of first source/drain regions disposed in a semiconductor substrate, wherein the first source/drain regions are laterally spaced;
   a first gate electrode disposed over the semiconductor substrate and between the first source/drain regions;
   a pair of second source/drain regions disposed in the semiconductor substrate and spaced from the pair of first source/drain regions, wherein the second source/drain regions are laterally spaced;
   a second gate electrode disposed over the semiconductor substrate and between the second source/drain regions;
   a first silicide structure disposed over one of the first source/drain regions;
   a second silicide structure disposed over one of the second source/drain regions; and
   a silicide blocking structure disposed over the semiconductor substrate, wherein the silicide blocking structure comprises a first portion that extends vertically along a side of the first gate electrode, wherein the silicide blocking structure comprises a second portion that extends continuously from a first sidewall of the one of the first source/drain regions to a second sidewall of the one of the second source/drain regions, wherein the second portion of the silicide blocking structure has a third sidewall that faces the first portion of the silicide blocking structure, wherein the third sidewall extends vertically from an upper surface of the second portion of the silicide blocking structure to a lower surface of the second portion of the silicide blocking structure, and wherein a portion of the third sidewall is disposed vertically between an upper portion of the first silicide structure and the semiconductor substrate.

2. The semiconductor device of claim 1, further comprising:
   a first isolation structure disposed in the semiconductor substrate and between the one of the first source/drain regions and the one of the second source/drain regions, wherein the second portion of the silicide blocking structure extends from the first sidewall to the second sidewall by extending continuously over the first isolation structure.

3. The semiconductor device of claim 2, further comprising:
   a second isolation structure disposed in the semiconductor substrate and spaced from the first isolation structure, wherein the second isolation structure is disposed between the one of the first source/drain regions and the one of the second source/drain regions, and wherein the second portion of the silicide blocking structure extends from the first sidewall to the second sidewall by extending continuously over both the first isolation structure and the second isolation structure.

4. The semiconductor device of claim 1, wherein the upper surface of the second portion of the silicide blocking structure is substantially planar and extends continuously from the first sidewall to the second sidewall.

5. The semiconductor device of claim 1, wherein:
   the silicide blocking structure comprises a third portion that extends vertically along a side of the second gate electrode; and
   the second portion of the silicide blocking structure is disposed between the first portion of the silicide blocking structure and the third portion of the silicide blocking structure.

6. The semiconductor device of claim 5, wherein:
   both the first silicide structure and the second silicide structure are disposed between the first portion of the silicide blocking structure and the third portion of the silicide blocking structure; and
   the second portion of the silicide blocking structure is disposed between the first silicide structure and the second silicide structure.

7. The semiconductor device of claim 1, further comprising:
   a first sidewall spacer disposed over the semiconductor substrate and extending vertically along the side of the first gate electrode, wherein the first sidewall spacer is disposed between the first gate electrode and the first portion of the silicide blocking structure.

8. The semiconductor device of claim 7, further comprising:
   a second sidewall spacer disposed over the semiconductor substrate and extending vertically along a side of the second gate electrode, wherein the second sidewall spacer is disposed between the second gate electrode and a third portion of the silicide blocking structure, wherein the third portion of the silicide blocking structure extends vertically along a side of the second sidewall spacer, and wherein the second portion of the silicide blocking structure is disposed between the first portion of the silicide blocking structure and the third portion of the silicide blocking structure.

9. A semiconductor device, comprising:
   a first source/drain region and a second source/drain region disposed in a semiconductor substrate, wherein the first source/drain region is laterally spaced from the second source/drain region;
   a gate electrode disposed over the semiconductor substrate and between the first source/drain region and the second source/drain region;
   a first isolation structure disposed in the semiconductor substrate, wherein the first source/drain region is disposed between the first isolation structure and the gate electrode, and wherein the first isolation structure has a first sidewall and a second sidewall that is opposite the first sidewall;

a first silicide structure disposed over the first source/drain region, wherein the first silicide structure is disposed between the first isolation structure and the gate electrode; and a first silicide blocking structure disposed over the semiconductor substrate and the first isolation structure, wherein the first silicide blocking structure extends continuously from the first sidewall to at least the second sidewall, wherein the first silicide blocking structure has a third sidewall that faces the gate electrode, wherein the third sidewall extends vertically from a first upper surface of the first silicide blocking structure to a lower surface of the first silicide blocking structure, and wherein a portion of the third sidewall is disposed vertically between an uppermost surface of the first silicide structure and the semiconductor substrate.

10. The semiconductor device of claim 9, further comprising:

a second silicide blocking structure disposed over the semiconductor substrate, wherein the second silicide blocking structure extends vertically along a first side of the gate electrode, and wherein the first silicide structure contacts the third sidewall of the first silicide blocking structure, and wherein the second silicide blocking structure contacts a fourth sidewall of the first silicide structure.

11. The semiconductor device of claim 10, wherein the second silicide blocking structure has a second upper surface that is substantially co-planar with the first upper surface.

12. The semiconductor device of claim 9, further comprising:

a second isolation structure disposed in the semiconductor substrate, wherein the gate electrode is disposed between the first isolation structure and the second isolation structure, and wherein the second isolation structure has a fifth sidewall and a sixth sidewall that is opposite the fifth sidewall;

a second silicide structure disposed over the second source/drain region, wherein the second silicide structure is disposed between the second isolation structure and the gate electrode; and a third silicide blocking structure disposed over the semiconductor substrate and the second isolation structure, wherein the third silicide blocking structure extends continuously from the fifth sidewall to at least the sixth sidewall.

13. The semiconductor device of claim 12, further comprising:

a second silicide blocking structure disposed over the semiconductor substrate, wherein the second silicide blocking structure extends vertically along a first side of the gate electrode, and wherein the first silicide structure contacts the third sidewall of the first silicide blocking structure, and wherein the second silicide blocking structure contacts a fourth sidewall of the first silicide structure; and a fourth silicide blocking structure disposed over the semiconductor substrate, wherein the fourth silicide blocking structure extends vertically along a second side of the gate electrode opposite the first side, and wherein the fourth silicide blocking structure contacts a seventh sidewall of the second silicide structure, and wherein the third silicide blocking structure contacts an eighth sidewall of the second silicide blocking structure opposite the seventh sidewall.

14. The semiconductor device of claim 13, wherein:
the second silicide blocking structure has a second upper surface;
the third silicide blocking structure has a third upper surface;
the fourth silicide blocking structure has a fourth upper surface; and
the first upper surface, the second upper surface, the third upper surface, and the fourth upper surface are substantially co-planar.

15. A semiconductor device, comprising:

a first source/drain region and a second source/drain region disposed in a semiconductor substrate, wherein the first source/drain region is laterally spaced from the second source/drain region;

a first gate electrode disposed over the semiconductor substrate and between the first source/drain region and the second source/drain region;

a first sidewall spacer disposed over the semiconductor substrate and along a first sidewall of the first gate electrode;

a second sidewall spacer disposed over the semiconductor substrate and along a second sidewall of the first gate electrode opposite the first sidewall;

a first silicide structure disposed over the first source/drain region;

a second silicide structure disposed over the second source/drain region;

a first silicide blocking structure disposed over the semiconductor substrate, wherein a first portion of the first silicide blocking structure extends vertically from the semiconductor substrate along an outer sidewall of the first sidewall spacer, wherein a second portion of the first silicide blocking structure extends laterally a first distance from the first portion to the first silicide structure, and wherein the first portion has a first uppermost surface disposed over a second uppermost surface of the second portion; and a second silicide blocking structure disposed over the semiconductor substrate, wherein a third portion of the second silicide blocking structure extends vertically from the semiconductor substrate along an outer sidewall of the second sidewall spacer, wherein a fourth portion of the second silicide blocking structure extends laterally the first distance from the third portion to the second silicide structure, and wherein the third portion has a third uppermost surface disposed over a fourth uppermost surface of the fourth portion, wherein the fourth portion of the second silicide structure has a third sidewall that extends vertically from the fourth uppermost surface to a lower surface of the fourth portion of the second silicide blocking structure, and wherein a portion of the third sidewall is disposed vertically between an upper surface of the second silicide structure and the semiconductor substrate.

16. The semiconductor device of claim 15, further comprising:

a third source/drain region and a fourth source/drain region disposed in the semiconductor substrate, wherein the third source/drain region is laterally spaced from the fourth source/drain region, and wherein both the third and fourth source/drain regions are laterally spaced from both the first and second source/drain regions;

a second gate electrode disposed over the semiconductor substrate and between the third source/drain region and the fourth source/drain region;

a third sidewall spacer disposed over the semiconductor substrate and along a fourth sidewall of the second gate electrode;

a fourth sidewall spacer disposed over the semiconductor substrate and along a fifth sidewall of the second gate electrode opposite the fourth sidewall;

a third silicide structure disposed over the third source/drain region and spaced a second distance from the second gate electrode, wherein the second distance is less than the first distance; and a fourth silicide structure disposed over the fourth source/drain region and spaced the second distance from the second gate electrode.

17. The semiconductor device of claim 15, wherein:

the first portion of the first silicide blocking structure has a sixth sidewall disposed between the first sidewall of the first gate electrode and the second sidewall of the first gate electrode; and the third portion of the second silicide blocking structure has a seventh sidewall disposed between the first sidewall of the first gate electrode and the second sidewall of the first gate electrode.

18. The semiconductor device of claim 15, further comprising:

a gate dielectric disposed between the semiconductor substrate and the first gate electrode, wherein the first silicide blocking structure contacts the first sidewall spacer, the gate dielectric, and the first gate electrode.

19. The semiconductor device of claim 15, wherein:

the second uppermost surface extends from the first portion of the first silicide blocking structure to an outer sidewall of the first silicide structure;

the fourth uppermost surface extends from the third portion of the second silicide blocking structure to an outer sidewall of the second silicide structure;

the second uppermost surface is substantially planar; and the fourth uppermost surface is substantially planar.

20. The semiconductor device of claim 19, wherein the fourth uppermost surface and the third uppermost surface are substantially co-planar.

* * * * *